(12) United States Patent
Takahashi et al.

(10) Patent No.: US 9,711,536 B2
(45) Date of Patent: Jul. 18, 2017

(54) SEMICONDUCTOR DEVICE, ELECTRONIC COMPONENT, AND ELECTRONIC DEVICE

(71) Applicant: SEMICONDUCTOR ENERGY LABORATORY CO., LTD., Atsugi-shi, Kanagawa-ken (JP)

(72) Inventors: Kei Takahashi, Kanagawa (JP); Hiroyuki Miyake, Kanagawa (JP); Hidekazu Miyairi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 117 days.

(21) Appl. No.: 14/633,220

(22) Filed: Feb. 27, 2015

(65) Prior Publication Data
US 2015/0255492 A1 Sep. 10, 2015

(30) Foreign Application Priority Data
Mar. 7, 2014 (JP) ................. 2014-044471

(51) Int. Cl.
*H01L 27/12* (2006.01)
*G09G 3/3291* (2016.01)
*G09G 3/36* (2006.01)

(52) U.S. Cl.
CPC ....... *H01L 27/1225* (2013.01); *G09G 3/3291* (2013.01); *G09G 3/3688* (2013.01);
(Continued)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Nicholas Lee
*Assistant Examiner* — Duane N Taylor, Jr.
(74) *Attorney, Agent, or Firm* — Nixon Peabody LLP; Jeffrey L. Costellia

(57) ABSTRACT

To provide a semiconductor device including a small-area circuit with high withstand voltage, an oxide semiconductor (OS) transistor is used as some of transistors included in a circuit handling an analog signal in a circuit to which high voltage is applied. The use of an OS transistor with high withstand voltage as a transistor requiring resistance to high voltage enables the circuit area to be reduced without lowering the performance, as compared to the case using a Si transistor. Furthermore, an OS transistor can be provided over a Si transistor, so that transistors using different semiconductor layers can be stacked, resulting in a much smaller circuit area.

9 Claims, 21 Drawing Sheets

(52) U.S. Cl.
CPC ......... *G09G 2300/0838* (2013.01); *G09G 2300/0871* (2013.01); *G09G 2310/027* (2013.01); *G09G 2310/0289* (2013.01); *G09G 2310/0291* (2013.01); *G09G 2330/04* (2013.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,094,107 | B2 * | 1/2012 | Nishimura ............ G09G 3/3688 345/690 |
| 8,519,990 | B2 | 8/2013 | Yamazaki et al. |
| 8,624,406 | B2 * | 1/2014 | Murahashi ........... G09G 3/3685 257/203 |
| 2001/0046027 | A1 | 11/2001 | Tai et al. |
| 2002/0047826 | A1 * | 4/2002 | Akimoto .............. G09G 3/3648 345/100 |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0242070 | A1 * | 10/2011 | Yamazaki ............ G09G 3/3688 345/204 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-286525 A | 11/2007 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1. pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S at al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTS With a Novel Passivation Layer", SID Digest '09: SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 11A
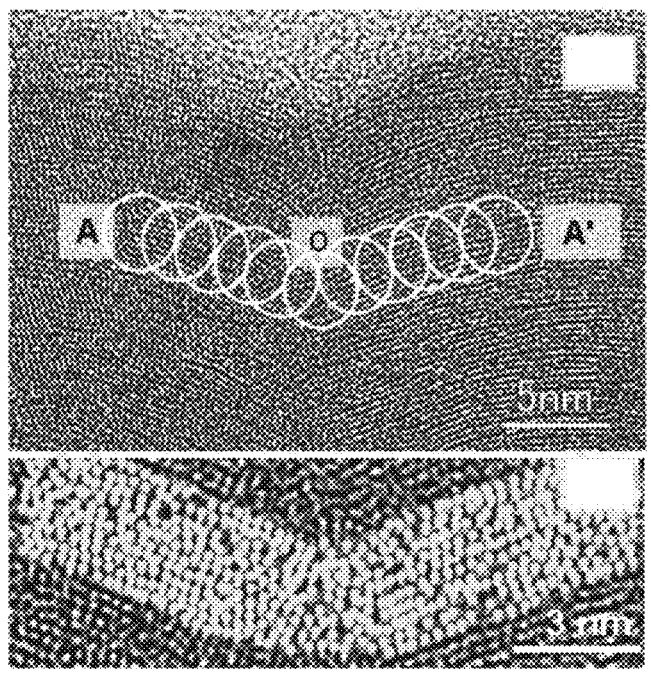
FIG. 11B
FIG. 11C
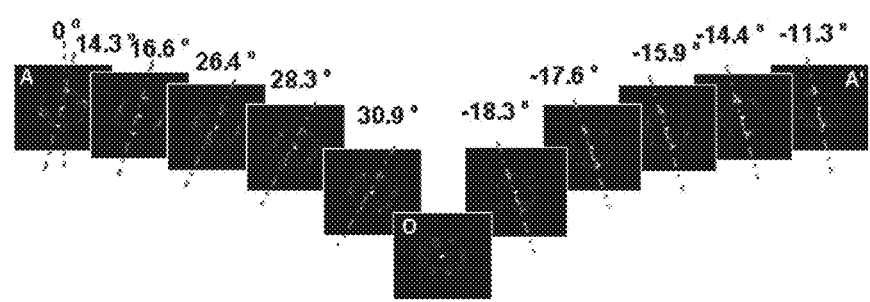

CAAC-OS nc-OS

☐ Proportion of non-CAAC    ☰ Proportion of CAAC

As-sputtered

After heat treatment at 450 °C

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A driver circuit of a display device is required to have higher performance to meet demand for multiple gray levels and higher definition of a display portion. Accordingly, an integrated circuit (IC, hereinafter also referred to as driver IC) is used as a driver circuit of a display device, particularly as a source driver (e.g., see Patent Document 1).

A driver IC is roughly divided into two parts: a data retention unit for handling a digital signal, such as a shift register and a latch; and a grayscale voltage generation unit such as a level shifter, a digital-to-analog converter (DAC) handling an analog signal, and an analog buffer.

The data retention unit for handling a digital signal needs to operate at high speed; thus, a transistor included in the data retention unit is minutely processed and operates at low voltage. Meanwhile, the grayscale voltage generation unit for handling an analog signal operates at higher voltage than the data retention unit to handle a voltage for driving a display portion.

REFERENCE

Patent Document 1: Japanese Published Patent Application No. 2007-286525

SUMMARY OF THE INVENTION

Since a circuit portion handling an analog signal operates at higher voltage than a circuit portion handling a digital signal as described above, a transistor included in the circuit portion handling an analog signal is required to withstand higher voltage. To increase the withstand voltage, the size of the transistor in the circuit portion handling an analog signal is designed to be larger than that in the circuit portion handling a digital signal.

However, the increase in the transistor size for achieving higher withstand voltage leads to a larger circuit area. A reduction in size of a display device is demanded, and accordingly a reduction in the circuit area of a driver IC is required.

In view of the above, an object of one embodiment of the present invention is to provide a semiconductor device or the like with a novel structure that includes a circuit with a small area. Another object of one embodiment of the present invention is to provide a semiconductor device or the like with a novel structure that includes a circuit with high withstand voltage. Another object of one embodiment of the present invention is to provide a novel semiconductor device or the like.

Note that the objects of one embodiment of the present invention are not limited to the above. The objects described above do not disturb the existence of other objects. The other objects are objects that are not described above and will be described below. The other objects will be apparent from and can be derived from the description of the specification, the drawings, and the like by those skilled in the art. One embodiment of the present invention is to achieve at least one of the above objects and the other objects.

One embodiment of the present invention is a semiconductor device including a first circuit, a second circuit, and a third circuit. The first circuit receives a first signal and is capable of boosting a first voltage of the first signal into a second voltage. The second circuit is capable of converting the first signal into a second signal. The third circuit receives the second signal and is capable of amplifying a first amount of current to a second amount of current and outputting the second amount of current. The second circuit includes a plurality of wirings and a first transistor electrically connected to each of the plurality of wirings. The plurality of wirings are capable of transmitting different voltages. The first transistor is capable of operating as a switch. The first transistor includes a semiconductor layer containing an oxide semiconductor.

Another embodiment of the present invention is a semiconductor device including a first circuit, a second circuit, and a third circuit. The first circuit receives a first signal and is capable of boosting a first voltage of the first signal into a second voltage. The second circuit is capable of converting the first signal into a second signal. The third circuit receives the second signal and is capable of amplifying a first amount of current to a second amount of current and outputting the second amount of current. The second circuit includes a plurality of wirings, a first transistor, and a second transistor. The plurality of wirings include a first wiring capable of transmitting the first voltage, and a second wiring capable of transmitting the second voltage higher than the first voltage. The first transistor is capable of operating as a switch. The second transistor is capable of operating as a switch. The first transistor includes a semiconductor layer containing an oxide semiconductor. The second transistor includes a semiconductor layer containing silicon.

In the semiconductor device of one embodiment of the present invention, it is preferred that a channel region of the first transistor and a channel region of the second transistor partly overlap with each other.

In the semiconductor device of one embodiment of the present invention, it is preferred that the first circuit includes a third transistor electrically connected to a wiring applying the first voltage, and a fourth transistor electrically connected to a wiring applying the second voltage; and that the third transistor includes a semiconductor layer containing silicon, and the fourth transistor includes a semiconductor layer containing an oxide semiconductor.

Note that other embodiments of the present invention will be shown in Embodiments 1 to 6 and the drawings.

One embodiment of the present invention can provide a semiconductor device or the like with a novel structure that includes a circuit with a small area. Accordingly, the size of the semiconductor device can be small. Another embodiment of the present invention can provide a semiconductor device or the like with a novel structure that includes a circuit with high withstand voltage. Thus, the semiconductor device can have high reliability. Another embodiment of the present invention can provide a novel semiconductor device or the like.

Note that the effects of one embodiment of the present invention are not limited to the above. The effects described above do not disturb the existence of other effects. The other effects are effects that are not described above and will be described below. The other effects will be apparent from and can be derived from the description of the specification, the drawings, and the like by those skilled in the art. One embodiment of the present invention is to have at least one of the above effects and the other effects. Accordingly, one embodiment of the present invention does not have the above effects in some cases.

BRIEF DESCRIPTION OF THE DRAWINGS

In the accompanying drawings:

FIGS. 11A and 11B are cross-sectional TEM images of an oxide semiconductor, and FIG. 11C shows local Fourier transform images of the oxide semiconductor;

DETAILED DESCRIPTION OF THE INVENTION

Figure 1:
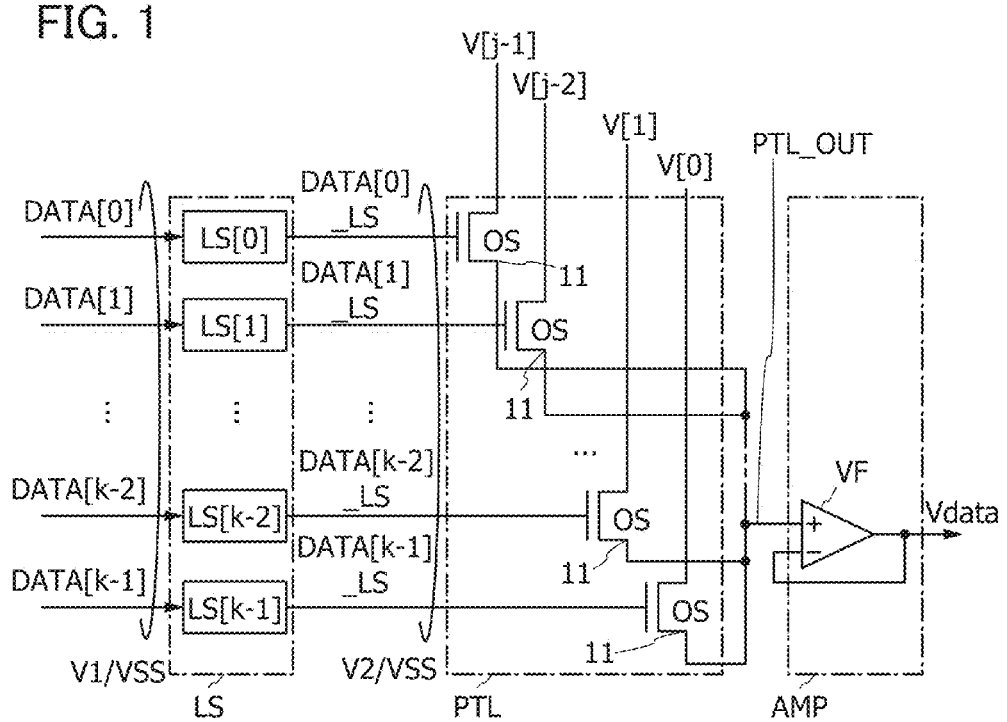
FIG. 1 is a circuit block diagram illustrating one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor may change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification, ordinal numbers such as first, second, and third are used to avoid confusion among components, and thus do not limit the number of the components.

In this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through Z1 (or by bypassing Z1) and a drain (or a second terminal or the like) of the transistor is electrically connected to Y through Z2 (or by bypassing Z2), or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other such that X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are only examples, and there is no limitation on the expressions. Here, X, Y, Z1, and Z2 each denote an object (e.g., a device, an element, a circuit, a wiring, an electrode, a terminal, a conductive film, or a layer).

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Embodiment 1

In this embodiment, examples of a circuit block diagram and a circuit diagram of a semiconductor device functioning as a driver IC will be described.

In this specification and the like, a semiconductor device means any device that can function by utilizing semiconductor characteristics; thus, a driver IC composed of semiconductor elements such as transistors and a display device including the driver IC are included in the category of the semiconductor device.

FIG. 1 is a circuit block diagram that schematically illustrates a semiconductor device.

The semiconductor device illustrated in FIG. 1 includes a level shifter LS, a pass transistor logic PTL, and an amplifier AMP.

A semiconductor device functioning as a driver IC is roughly divided into two parts: a data retention unit for sampling and retaining an input digital data signal, and a grayscale voltage generation unit for generating a grayscale voltage for a display portion on the basis of the data signal. The level shifter LS, the pass transistor logic PTL, and the amplifier AMP are included in the grayscale voltage generation unit.

Although not shown, the semiconductor device includes a data retention unit in addition to the circuits in the grayscale voltage generation unit illustrated in FIG. 1. A digital data signal retained in the data retention unit is input to the level shifter LS. This data signal is input as a low-voltage signal so that the circuit portion handling a digital signal is driven at high speed.

The level shifter LS in FIG. 1 is a circuit with a function of boosting and outputting an input digital data signal, for example. The level shifter LS boosts an input digital data signal into a high-voltage signal and outputs the high-voltage signal because a circuit supplied with the signal output from the level shifter LS handles a voltage for driving a display portion. The level shifter LS may be referred to as a booster circuit or simply as a circuit.

An example of the data signal input to the level shifter LS is digital image data. FIG. 1 illustrates data signals DATA[0]-DATA[k−1] (k is a natural number of 2 or more) as digital image data.

The level shifter LS includes a plurality of level shifters corresponding to the number of input data signals. FIG. 1 illustrates an example where level shifters LS[0]-LS[k−1] are provided. For example, the first level shifter LS[0] boosts an input data signal DATA[0] and outputs the resulting signal as a signal DATA[0]_LS. The same applies to the second and subsequent level shifters LS[1]-LS[k−1].

In the following description, the data signals DATA[0]-DATA[k−1] input to the level shifter LS are signals with a voltage amplitude of V1/VSS, and data signals DATA[0]_LS-DATA[k−1]_LS output from the level shifter LS are signals boosted to have a voltage amplitude of V2/VSS (V2>V1).

Note that "V1/VSS" means that the voltage amplitude ranges from a high power supply potential V1 to a low power supply potential VSS, and "V2/VSS" means that the voltage amplitude ranges from a high power supply potential V2 to the low power supply potential VSS. Note that the low power supply potential VSS may be a ground potential GND.

The pass transistor logic PTL illustrated in FIG. 1 is a circuit having a function of converting an input digital signal into an analog signal, for example. A data signal input to the pass transistor logic PTL is a digital signal, and the digital data signal is converted into an analog signal by the pass transistor logic PTL. The pass transistor logic PTL may be referred to as a digital-to-analog (D/A) converter circuit or simply as a circuit.

The pass transistor logic PTL includes transistors 11. The on/off states of the transistors 11 are controlled by the respective data signals DATA[0]_LS-DATA[k−1]_LS which are boosted by the level shifter LS. The transistor 11 functions as a switch.

A voltage of a data signal that is obtained by converting a digital signal into an analog signal by controlling the on/off state of the transistor 11 included in the pass transistor logic PTL corresponds to a grayscale voltage for the display portion. Although the voltage level varies depending on display elements included in pixels of the display portion, the voltage (V2/VSS) of an analog data signal needs to be higher than the voltage (V1/VSS) of a digital data signal for driving the data retention unit in the driver IC. Thus, in the level shifter LS, a voltage required to operate a switch for generating a voltage of an analog data signal is converted into the voltage (V2/VSS), which is higher than the voltage (V1/VSS) for driving the data retention unit in the driver IC.

The pass transistor logic PTL is supplied with a plurality of voltages V[0]-V[j−1] as well as the data signals DATA[0]_LS-DATA[k−1]_LS which are boosted by the level shifter LS. The data signals DATA[0]_LS-DATA[k−1]_LS are supplied to gates of the transistors 11. The voltages V[0]-V[j−1] are supplied to sources or drains of the transistors 11. In accordance with the on/off state of the transistors 11, the pass transistor logic PTL can output an output signal PTL_OUT that is an analog signal corresponding to the voltages V[0]-V[j−1].

The amplifier AMP illustrated in FIG. 1 is a circuit having a function of increasing (amplifying) the amount of current to be output by making the voltage of an input signal and that of an output signal the same, for example. That is, the amplifier AMP has a function of outputting a signal with an increasing amount of current. The amplifier AMP includes a voltage follower VF to which the output signal PTL_OUT is input. The amplifier AMP may be referred to as an amplification circuit or simply as a circuit.

A signal input to the amplifier AMP is the analog output signal PTL_OUT. The amplifier AMP amplifies a first amount of current of the output signal PTL_OUT to a second amount of current of an analog data signal Vdata and outputs the analog data signal Vdata. The data signal Vdata output from the amplifier AMP is a signal obtained by conversion into an analog signal based on the digital data signals DATA[0]-DATA[k−1].

In the semiconductor device serving as the driver IC in FIG. 1, the data signals DATA[0]-DATA[k−1] that are input as digital signals are converted into the analog data signal Vdata and the data signal Vdata is output to a pixel in the display portion. A display element in the pixel needs a voltage higher than a voltage for driving the driver IC; consequently, the on/off state of a transistor on the output side of the driver IC is controlled with higher voltage than that on the input side to obtain a signal with an intended voltage. For example, a transistor on the input side of the driver IC is controlled at a low voltage of approximately 2 V to 3 V for high-speed control, whereas a transistor on the output side of the driver IC needs to be controlled at a high voltage of approximately 5 V to 10 V.

In the configuration of the semiconductor device in one embodiment of the present invention, a transistor that uses silicon for a semiconductor layer serving as a channel formation region (hereinafter referred to as Si transistor) and requires resistance to high voltage is replaced with a transistor with resistance to high voltage. Specifically, in the configuration in FIG. 1, the transistor included in the pass transistor logic PTL, which requires resistance to high voltage in the driver IC, is replaced with a transistor using an oxide semiconductor for a semiconductor layer serving as a channel formation region (hereinafter referred to as OS transistor).

The semiconductor device in FIG. 1 includes the level shifter LS, the pass transistor logic PTL, and the amplifier AMP and selectively uses OS transistors as transistors requiring high withstand voltage in each of the circuits, whereby the circuits in the semiconductor device can have a smaller area than those using only Si transistors with large L. Moreover, the OS transistors contain a semiconductor with a wider band gap than that of a Si transistor; thus, the transistors in the driver IC can have high withstand voltage without increasing in size. As a result, a highly reliable semiconductor device can be provided.

Note that L refers to channel length and means a length in the direction in which carriers move at the shortest distance between a pair of impurity regions serving as a source region and a drain region. In addition, W refers to channel width and means a width in the direction perpendicular to the channel length direction.

If a Si transistor is used as a transistor that requires high withstand voltage in the pass transistor logic PTL, the circuit needs to be designed using a larger channel length to secure resistance to high voltage. An increase in the number of Si transistors with a larger channel length results in an increase in the circuit area.

On the other hand, when an OS transistor is used in the pass transistor logic PTL, resistance to high voltage is obtained without increasing the channel length in circuit design. A semiconductor layer serving as a channel formation region of the OS transistor can be formed using In—Ga—Zn-based oxide, for example. Since the band gap of In—Ga—Zn-based oxide is wider than that of silicon by approximately 1 eV to 2 eV, application of high voltage to the OS transistor is less likely to cause avalanche breakdown, that is, the OS transistor is highly resistant to high voltage. Thus, dielectric breakdown is unlikely to occur in the OS transistor, and transistor defects can be suppressed in a semiconductor device including OS transistors.

In the configuration in FIG. 1, OS transistors are used as the transistors 11 in the pass transistor logic PTL that are supplied with the data signals DATA[0]_LS-DATA[k−1]_LS which are boosted by the level shifter LS. This configuration can reduce the circuit area as compared to a configuration in which Si transistors with a larger channel length are used for circuit design to increase resistance to high voltage. Thus, the size of the semiconductor device can be decreased.

Figure 20:
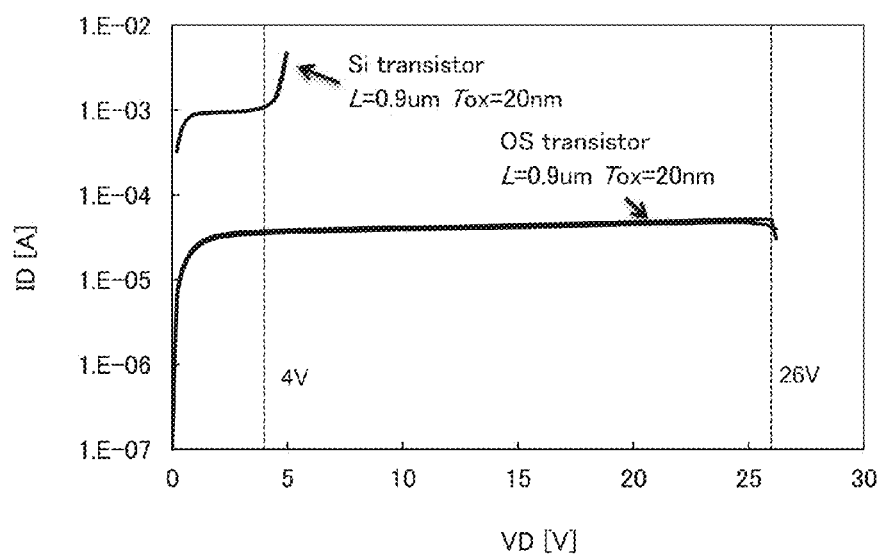
FIG. 20 shows ID-VD curves for describing one embodiment of the present invention.

FIG. 20 shows ID-VD curves of a Si transistor and an OS transistor for explaining drain breakdown voltage of the OS transistor. In FIG. 20, to compare resistance to high voltage between the Si transistor and the OS transistor under the same conditions, both of the transistors have a channel length of 0.9 µm, a channel width of 10 µm, and a thickness of a gate insulating film using silicon oxide of 20 nm. Note that the gate voltage is 2 V.

As shown in FIG. 20, avalanche breakdown occurs in the Si transistor at a drain voltage of approximately 4 V, whereas in the OS transistor, a constant current can flow until a drain voltage of approximately 26 V causes avalanche breakdown.

Figure 21A:
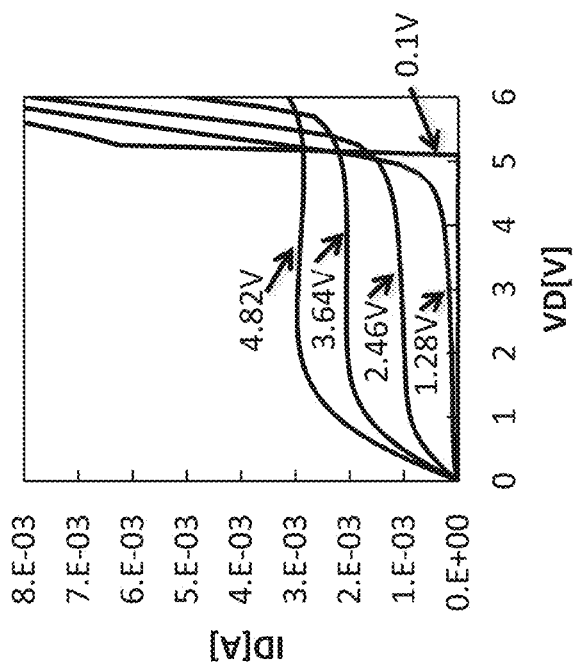
FIGS. 21A and 21B show ID-VD curves for describing one embodiment of the present invention.
Figure 21B:
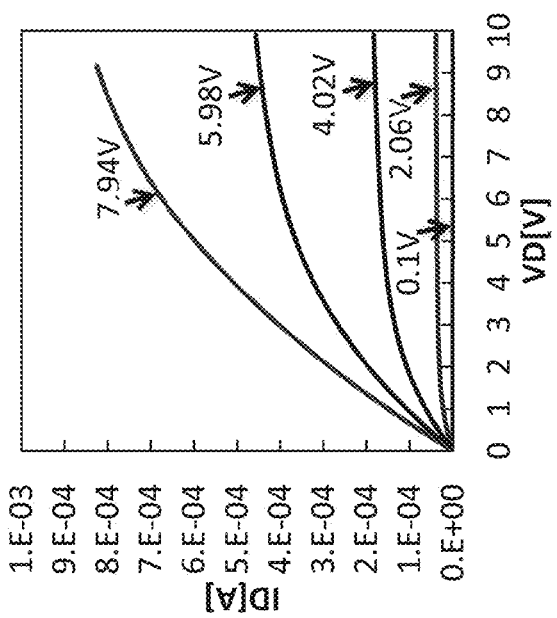

FIG. 21A shows ID-VD curves of an OS transistor with varying gate voltage. FIG. 21B shows ID-VD curves of a Si transistor with varying gate voltage. In FIGS. 21A and 21B, to compare resistance to high voltage between the Si transistor and the OS transistor under the same conditions, both of the transistors have a channel length of 0.9 µm, a channel width of 10 µm, and a thickness of a gate insulating film using silicon oxide of 20 nm. The gate voltage changes from 0.1 V to 2.06 V, 4.02 V, 5.98 V, and 7.94 V in the OS transistor of FIG. 21A, and changes from 0.1 V to 1.28 V, 2.46 V, 3.64 V, and 4.82 V in the Si transistor of FIG. 21B.

As shown in FIG. 21B, avalanche breakdown occurs in the Si transistor at a drain voltage of approximately 4 V to 5V, whereas in the OS transistor, a constant current can flow at a drain voltage of approximately 9 V without causing avalanche breakdown as shown in FIG. 21A.

As seen from FIG. 20 and FIGS. 21A and 21B, the OS transistor has higher resistance to high voltage than the Si transistor; thus, dielectric breakdown is unlikely to occur in the OS transistor, and transistor defects can be suppressed in a semiconductor device including OS transistors.

The OS transistor can be stacked over the Si transistor and thus is suitable to further reduce the area of the pass transistor logic PTL. In addition, the OS transistor can be stacked over another OS transistor, which is suitable for further area reduction of the pass transistor logic PTL.

Note that in the circuit diagrams, "OS" is used to denote an OS transistor and "Si" is used to denote a Si transistor.

The OS transistor used in the configuration of FIG. 1 can exhibit ultra-low off-state current.

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1\times10^{17}/cm^3$, preferably lower than $1\times10^{15}/cm^3$, further preferably lower than $1\times10^{13}/cm^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves ultra-low off-state current.

For example, the OS transistor with reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.

Note that the off-state current is a current that flows between a source and a drain when a transistor is off. For example, the off-state current of an n-channel transistor with a threshold voltage of about 0 V to 2 V refers to a current that flows between a source and a drain when a negative voltage is applied between a gate and the source.

Since the OS transistor exhibits ultra-low off-state current as described above, the use of the OS transistor in the pass transistor logic PTL enables the amount of current that flows slightly through the transistor in the off state to be extremely small. Thus, current consumption is decreased, resulting in lower power consumption of the semiconductor device.

Although FIG. 1 illustrates the configuration in which all the transistors in the pass transistor logic PTL are OS transistors, only some of them may be OS transistors.

Figure 2:
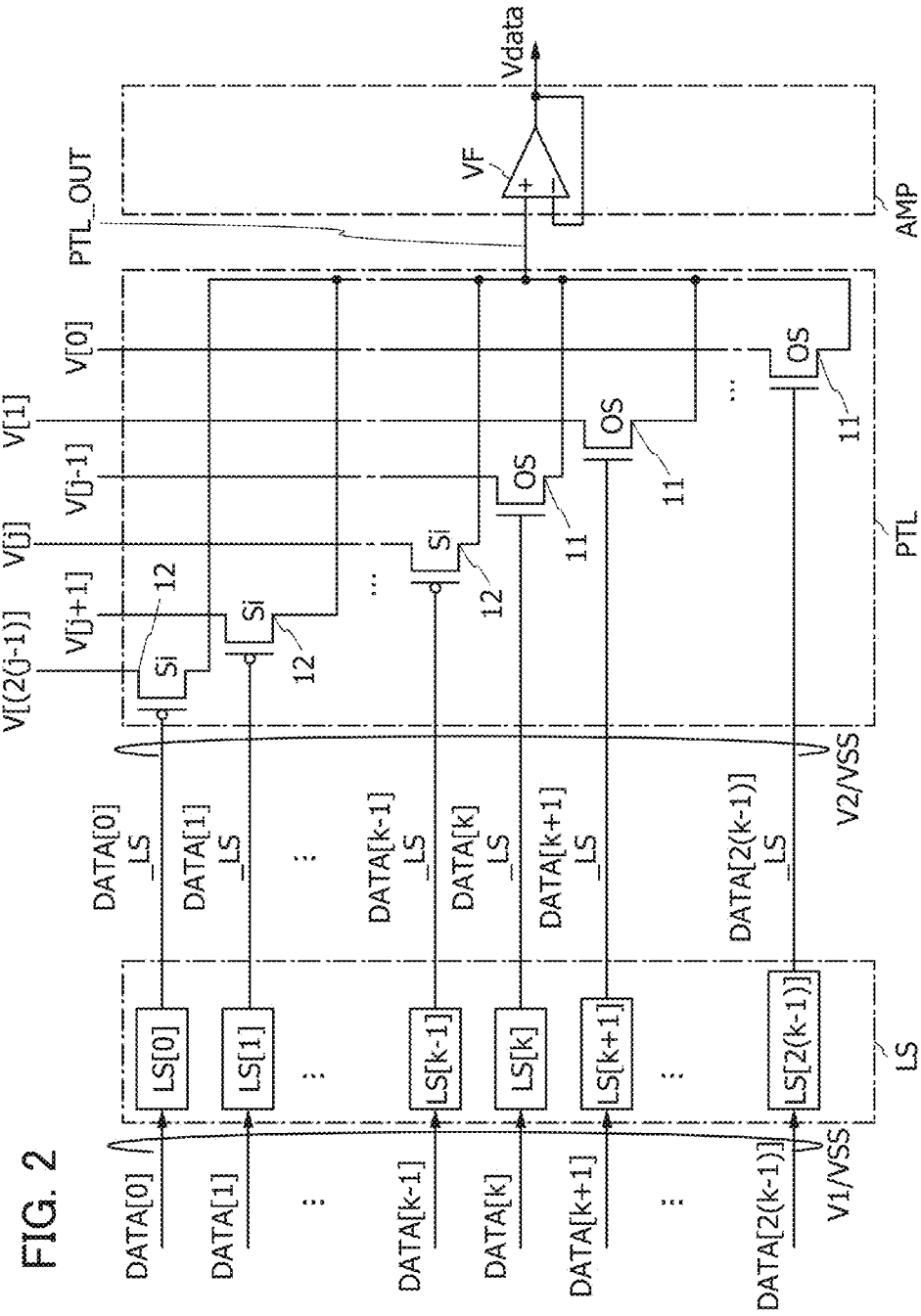
FIG. 2 is a circuit block diagram illustrating one embodiment of the present invention.

FIG. 2 illustrates an example of a configuration using OS transistors as some of the transistors in the pass transistor logic PTL.

In FIG. 2, input data signals are denoted by DATA[0]-DATA[2(k-1)], and DATA[0]-DATA[k-1] are high order bits and DATA[k]-DATA[2(k-1)] are low order bits. In the pass transistor logic PTL with the configuration in FIG. 2, a transistor to which a voltage based on a high order bit is applied is a Si transistor, and a transistor to which a voltage based on a low order bit is applied is an OS transistor.

In the pass transistor logic PTL, a higher voltage is applied to the transistor supplied with a voltage based on a high order bit than to the transistor supplied with a voltage based on a low order bit. In FIG. 2, a plurality of voltages applied to the pass transistor logic PTL are shown as voltages V[0]-V[2(j-1)], where V[0]<V[2(j-1)].

In FIG. 2, transistors 12 supplied with DATA[0]_LS-DATA[k-1]_LS obtained by boosting high order bits of data signals are p-channel Si transistors. The transistors 11 supplied with DATA[k]_LS-DATA[2(k-1)]_LS obtained by boosting DATA[k]-DATA[2(k-1)] corresponding to low order bits of data signals are OS transistors. Since DATA[0]_LS-DATA[k-1]_LS applied as high order bits are signals supplied to the p-channel Si transistors 12, signals with inverted logic levels of the digital signals are supplied.

With the configuration in FIG. 2, a voltage applied between a gate and source (hereinafter Vgs) of each transistor included in the pass transistor logic PTL can be increased. Thus, the on/off state of the transistor can be controlled without making a voltage (V2/VSS) boosted by the level shifter LS higher than the voltages V[0]-V[2(j-1)]. As a result, even though small transistors are used in the pass transistor logic PTL, the transistors secure resistance to high voltage, and the circuit area can be reduced.

The pass transistor logic PTL including a Si transistor and an OS transistor is suitable to further reduce the circuit area because the OS transistor and the Si transistor can be closely stacked. Furthermore, the OS transistor can be stacked over another OS transistor, which is suitable for further reduction in the circuit area.

Figure 3:
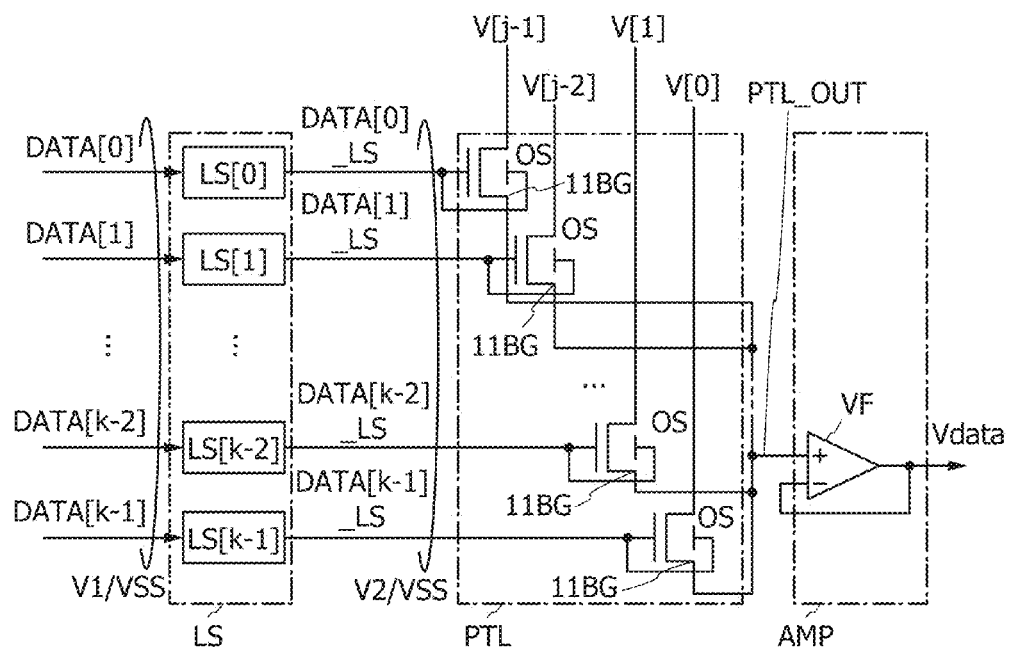
FIG. 3 is a circuit block diagram illustrating one embodiment of the present invention.

As another configuration example, the transistors included in the pass transistor logic PTL may be transistors 11BG having a backgate (also referred to as second gate) as illustrated in FIG. 3.

When the transistors in the pass transistor logic PTL are the transistors 11BG with a backgate, the area of a semiconductor layer to which an electric field is applied can be increased even with the same circuit area. Accordingly, even when the transistors are designed to fit a smaller circuit area, the pass transistor logic PTL can operate without reducing the amount of current flowing through the transistors.

In the configuration of FIG. 1, an OS transistor can be used as some of the transistors in the level shifter LS.

Figure 4:
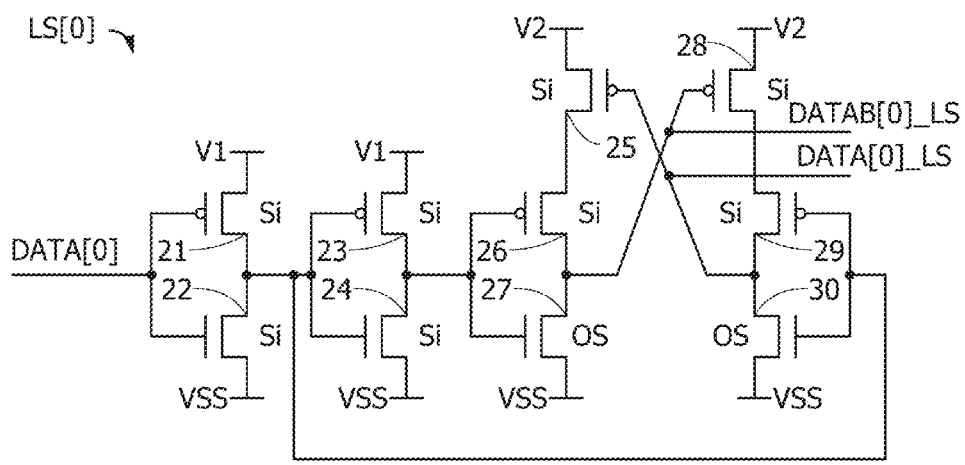
FIG. 4 is a circuit diagram illustrating one embodiment of the present invention.

FIG. 4 illustrates an example of a specific circuit configuration of the level shifter LS, here the level shifter LS[0]. The level shifter LS includes transistors 21 to 30. The transistors 21 and 22 and the transistors 23 and 24 that serve as inverters are supplied with the voltage V1/VSS. The transistors 25 to 30 serving as a buffer are supplied with the voltage V2/VSS.

Note that DATAB[0]_LS illustrated in FIG. 4 is a signal obtained by inverting the logic level of DATA[0]_LS.

In the level shifter LS, an OS transistor is provided as at least one of the transistors 25 to 30, which function as a buffer and are provided between wirings for supplying the voltage V2/VSS. In the example illustrated in FIG. 4, the transistors 27 and 30 are OS transistors and the other transistors are Si transistors.

The semiconductor device with the configuration of FIG. 4 can have a smaller circuit area than a semiconductor device using Si transistors with large L in the level shifter LS as well as in the pass transistor logic PTL. In addition, power consumption of the semiconductor device can be reduced because current consumed when the OS transistors are off is suppressed.

In the configuration of FIG. 1, an OS transistor can be used in the amplifier AMP.

Figure 5:
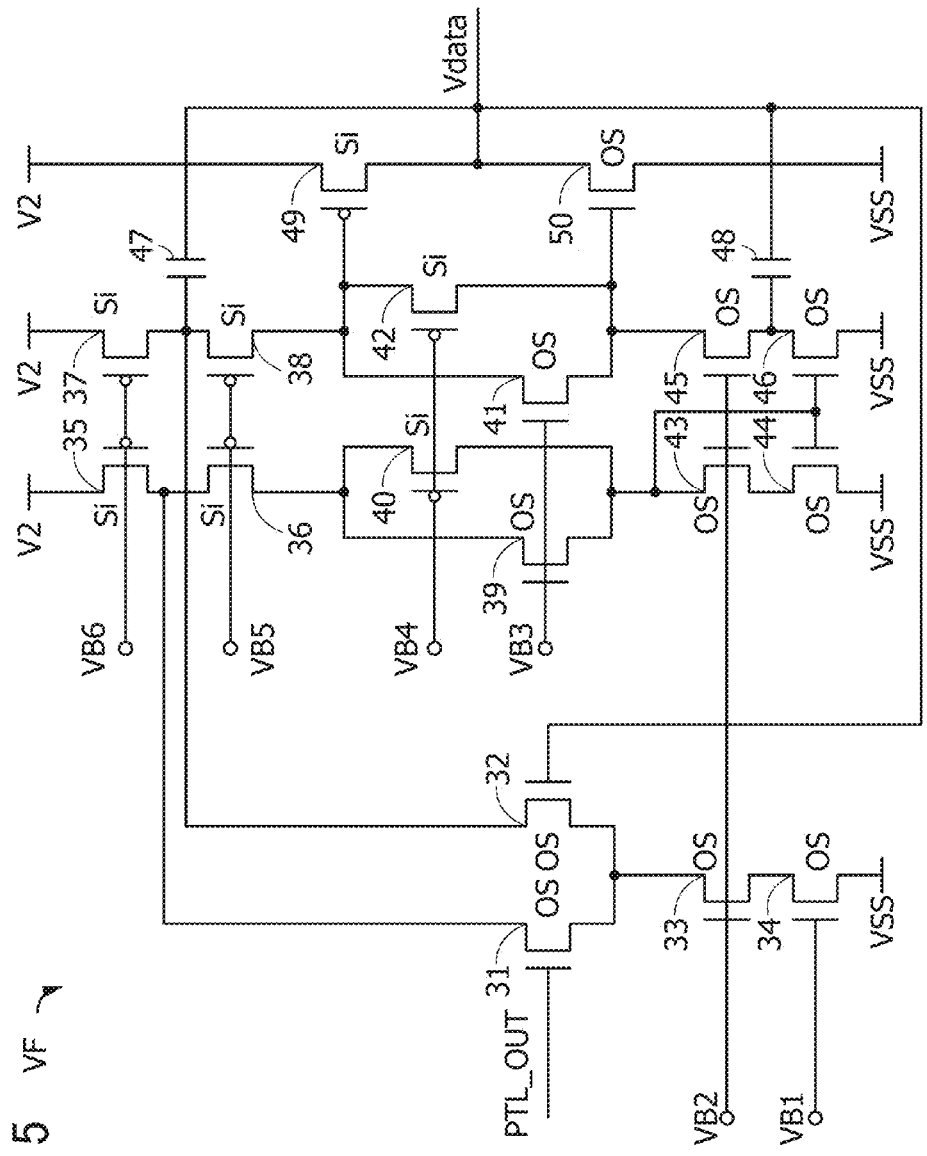
FIG. 5 is a circuit diagram illustrating one embodiment of the present invention.

FIG. 5 illustrates an example of a specific circuit configuration of the voltage follower VF included in the amplifier AMP. The voltage follower VF includes transistors 31 to 46, capacitors 47 and 48, and transistors 49 and 50. The voltage follower VF is roughly divided into three parts: a differential input unit having the transistors 31 to 34, an amplifier unit having the transistors 35 to 46 and the capacitors 47 and 48, and a buffer unit having the transistors 49 and 50.

The voltage follower VF is supplied with the voltage V2/VSS. Note that the voltage follower VF may be supplied with voltages different from the voltage V2/VSS, which are applied to the pass transistor logic PTL. For example, the voltage follower VF may be supplied with voltages V3 and VSS; the voltage V3 is higher than the voltage V2. The voltage follower VF is also supplied with bias voltages VB1 to VB6.

In the example illustrated in FIG. 5, the transistors 31 to 34, 39, 41, 43 to 46, and 50 are OS transistors and the other transistors are Si transistors.

The semiconductor device with the configuration of FIG. 5 can have a smaller circuit area than a semiconductor device using Si transistors with large L in the voltage follower VF as well as in the pass transistor logic PTL. Moreover, power consumption of the semiconductor device can be reduced because current consumed when the OS transistors are off is suppressed.

In the voltage follower VF, an output voltage changes with threshold voltage variation in the transistors. The output voltage of the voltage follower VF is a voltage for outputting a grayscale voltage for the display portion, and preferably changes as little as possible because human eyes are sensitive to grayscale deviation. Since the threshold voltage is controlled by impurity element addition or the like more easily in a Si transistor than in an OS transistor, it may be preferable that some of the OS transistors in FIG. 5 be Si transistors.

Figure 6:
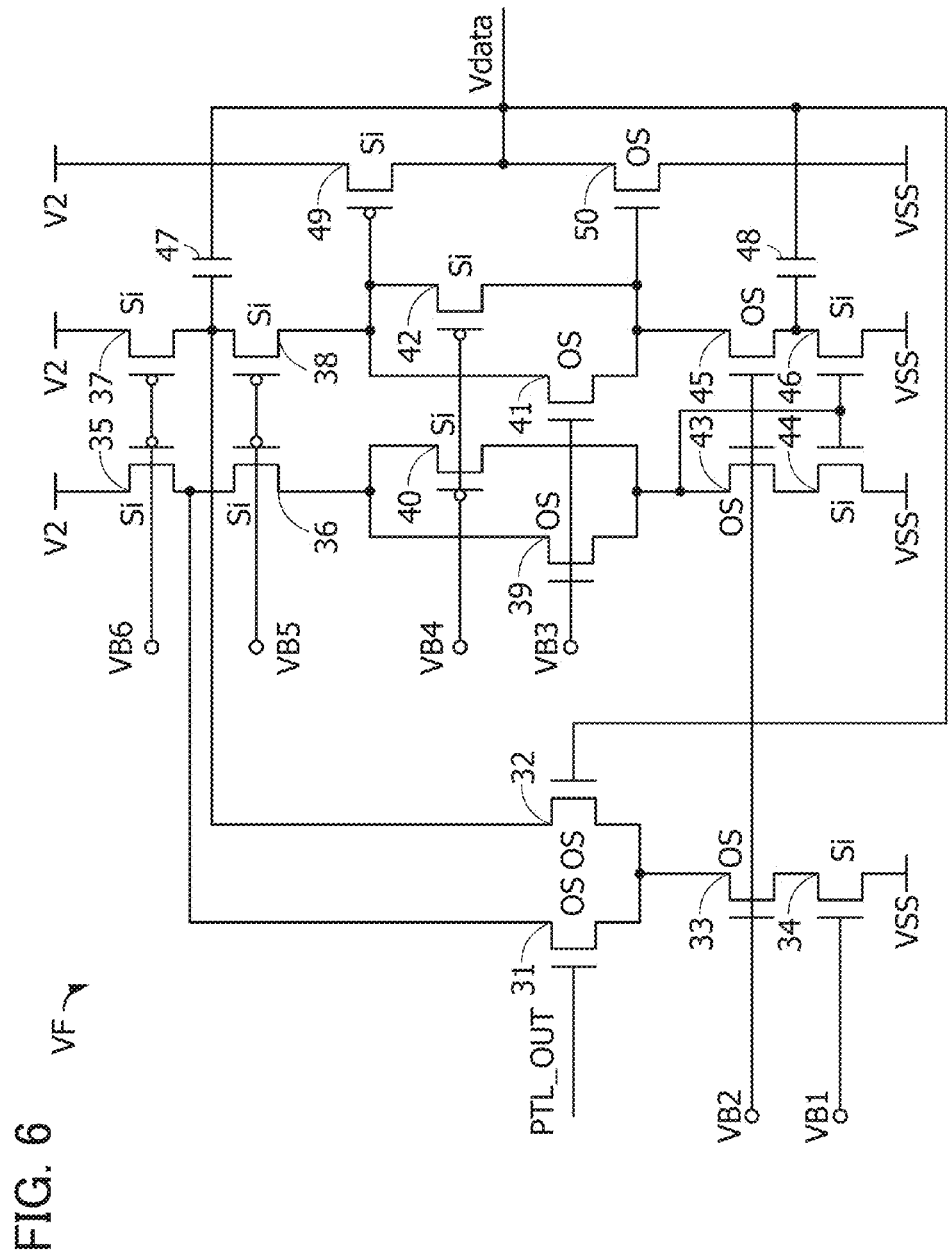
FIG. 6 is a circuit diagram illustrating one embodiment of the present invention.

For example, OS transistors are preferably used as transistors to which high voltage is relatively less likely to be applied in the voltage follower VF. For instance, the transistors 31, 32, 33, 39, 41, 43, 45, and 50 are OS transistors and the other transistors are Si transistors as illustrated in FIG. 6. With this configuration, an output voltage of the voltage follower VF is less likely to be affected by threshold voltage variation in the transistors, so that an output voltage with an intended value is obtained.

Note that the voltages V[0]-V[j−1] described using FIG. 1, which are applied to the pass transistor logic PTL, are generated by a voltage generator circuit composed of resistors connected in series.

Figure 7:
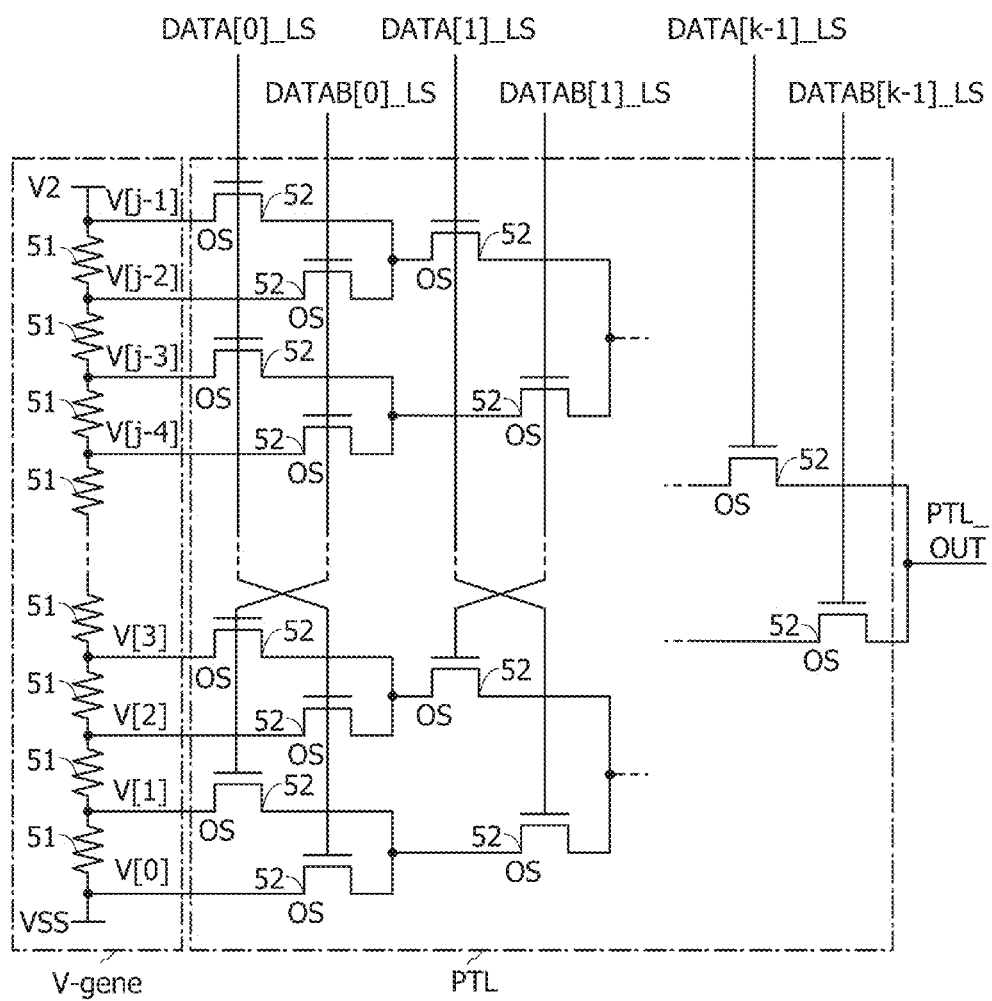
FIG. 7 is a circuit diagram illustrating one embodiment of the present invention.

A voltage generator circuit V-gene illustrated in FIG. 7 is an example of a circuit including a plurality of resistors 51 for generating the voltages V[0]-V[j−1]. In the voltage generator circuit V-gene in FIG. 7, the resistors 51 are provided in series between wirings for supplying the voltage V2/VSS. The voltages V[0]-V[j−1] are obtained by dividing the voltage V2/VSS using the resistors 51.

FIG. 7 illustrates a configuration example of the pass transistor logic PTL in addition to a configuration example of the voltage generator circuit V-gene. The pass transistor logic PTL with the configuration in FIG. 7 can generate a plurality of voltages that are smaller in number than data signals. Consequently, the number of transistors in the pass transistor logic PTL can be reduced.

When an n-channel OS transistor is provided close to a wiring for supplying the high power supply potential, a voltage that is reduced by the threshold voltage of the transistor is output. For this reason, among the transistors supplied with the voltages V[0]-V[j−1], a p-channel transistor is used as a transistor connected to a wiring that is much affected by a reduction in threshold voltage, whereas an n-channel OS transistor is used as a transistor connected to a wiring that is less affected by a reduction in threshold voltage. This configuration can reduce the circuit area, increase resistance to high voltage, and almost eliminate the influence of the threshold voltage on the output voltage.

Figure 8:
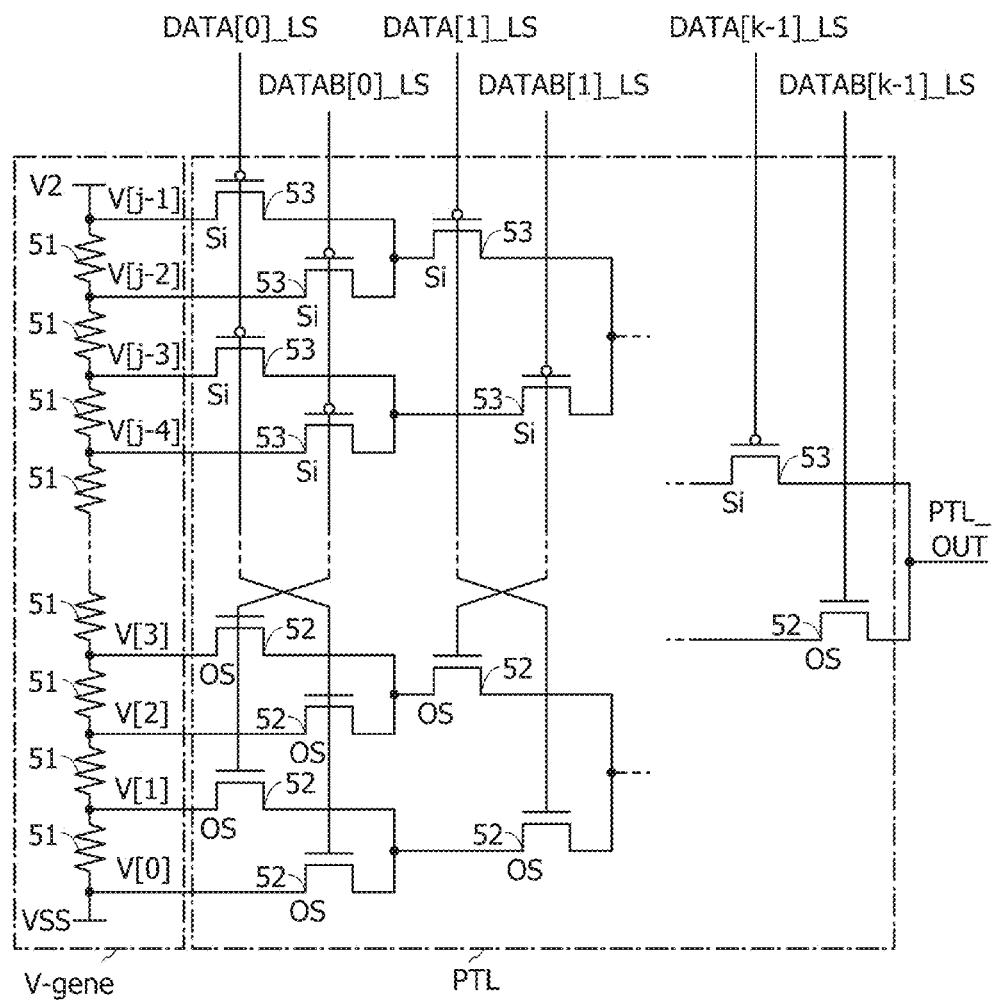
FIG. 8 is a circuit diagram illustrating one embodiment of the present invention.

In the configuration of FIG. 7, an OS transistor and a Si transistor may be selectively used as illustrated in FIG. 8 depending on whether a data signal supplied to each transistor is a high order bit or a low order bit as described with FIG. 2.

With the configuration in FIG. 8, Vgs of each transistor included in the pass transistor logic PTL can be increased. Thus, the on/off state of the transistor can be controlled without making a voltage (V2/VSS) boosted by the level shifter LS higher than the voltages V[0]-V[2(j−1)]. As a result, even though small transistors are used in the pass transistor logic PTL, the transistors secure resistance to high voltage, and the circuit area can be reduced.

The pass transistor logic PTL including a Si transistor and an OS transistor is suitable to further reduce the circuit area because the OS transistor and the Si transistor can be closely stacked. Furthermore, the OS transistor can be stacked over another OS transistor, which is suitable for further reduction in the circuit area.

As described above, the driver with the configuration in FIG. 1 includes the level shifter LS, the pass transistor logic PTL, and the amplifier AMP and selectively uses OS transistors as transistors requiring high withstand voltage in each of the circuits, whereby the circuits in the semiconductor device can have a smaller area than those using only Si transistors with large L. Moreover, the OS transistors contain a semiconductor with a wider band gap than that of a Si transistor; thus, the transistors in the driver can have high withstand voltage without increasing in size. As a result, a highly reliable semiconductor device can be provided.

This embodiment can be implemented in appropriate combination with any of the other embodiments.

Embodiment 2

Figure 9:
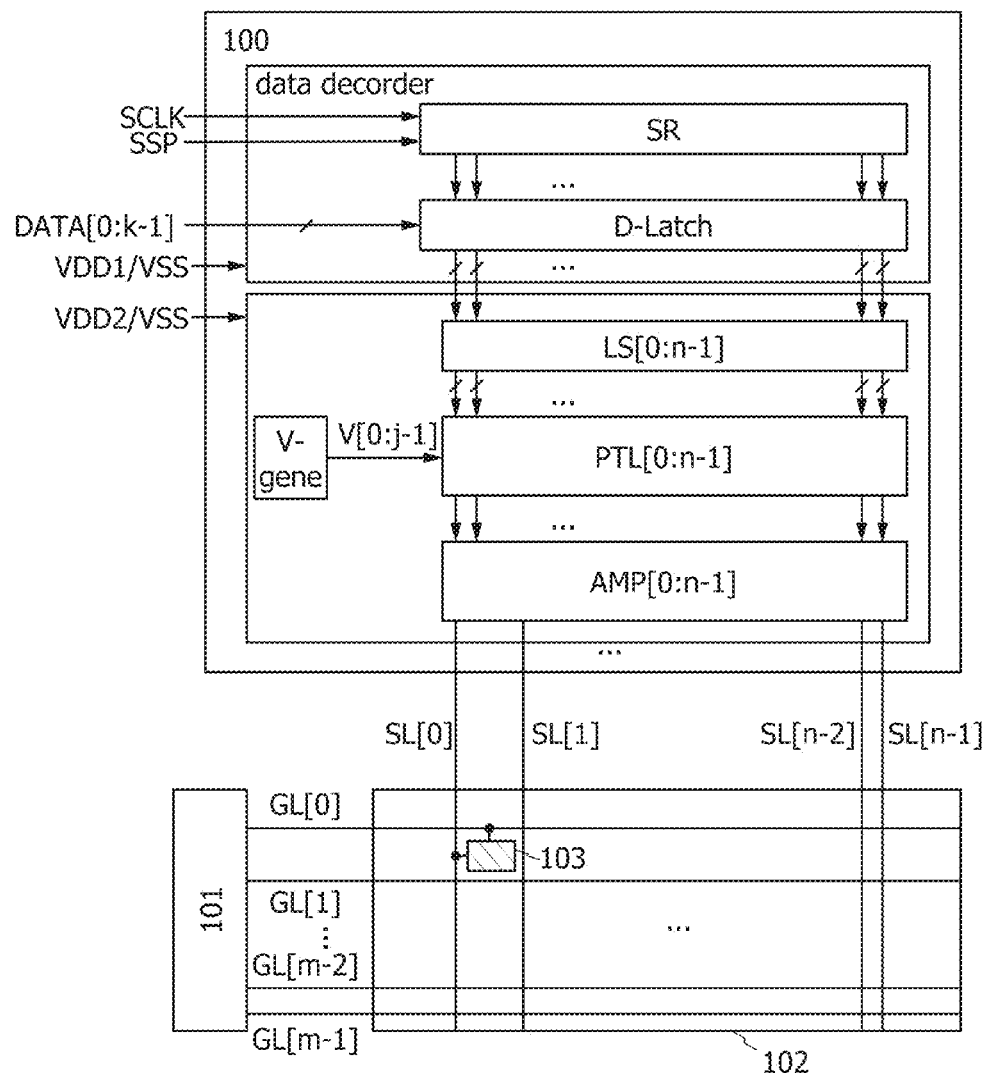
FIG. 9 is a circuit block diagram illustrating one embodiment of the present invention.

This embodiment will explain a circuit block diagram of a display device including the level shifter LS, the pass transistor logic PTL, and the amplifier AMP, which are described in Embodiment 1. FIG. 9 is a circuit block diagram illustrating a source driver, a gate driver, and a display portion.

The display device in the circuit block diagram of FIG. 9 includes a source driver 100, a gate driver 101, and a display portion 102. In FIG. 9, a pixel 103 is shown in the display portion 102.

The source driver 100 can have the driver IC described in Embodiment 1. Specifically, the source driver 100 includes a shift register SR, a data latch D-Latch, the level shifter LS, the pass transistor logic PTL, the voltage generator circuit V-gene, and the amplifier AMP. The source driver 100 has a function of outputting an analog data signal to source lines SL[0]-SL[n−1] (n is a natural number of 2 or more).

The shift register SR receives a source clock SCLK and a source start pulse SSP, for example. The shift register SR generates a sampling pulse and outputs it to the data latch D-Latch.

In addition to the sampling pulse, the data signals DATA[0]-DATA[k−1], which are digital image data, are input to the data latch D-Latch. The data signals DATA[0]-DATA[k−1] are latched into the data latch D-Latch in response to the sampling pulse. The data latch D-Latch outputs the latched data signals DATA[0]-DATA[k−1] to the level shifter LS.

The level shifter LS is as described in Embodiment 1. Specifically, the level shifter LS boosts the input signals DATA[0]-DATA[k−1] and outputs the signals DATA[0]_LS-DATA[k−1]_LS.

The pass transistor logic PTL is as described in Embodiment 1. Specifically, the pass transistor logic PTL controls the on/off state of the transistors in accordance with the boosted signals DATA[0]_LS-DATA[k−1]_LS and outputs the output signals PTL_OUT that are analog signals corresponding to the voltages V[0]-V[j−1] generated in the voltage generator circuit V-gene.

The amplifier AMP is as described in Embodiment 1. Specifically, the amplifier AMP increases the amount of current of the output signal PTL_OUT input thereto and outputs the data signal Vdata with an increasing current.

The data signals Vdata obtained in the amplifier AMP are analog signals output to the source lines SL[0]-SL[n−1].

The gate driver 101 includes a shift register and a buffer, for example. The gate driver 101 receives a gate start pulse, a gate clock signal, and the like and outputs a pulse signal. A circuit included in the gate driver 101 may be an IC as in the source driver 100 or may be formed using a transistor similar to that in the pixel 103 of the display portion 102.

The gate driver 101 outputs scan signals to gate lines GL[0]-GL[m−1] (m is a natural number of 2 or more). Note that a plurality of gate drivers 101 may be provided to separately control the gate lines GL[0]-GL[m−1].

In the display portion 102, the gate lines GL[0]-GL[m−1] and the source lines SL[0]-SL[n−1] are provided to intersect at substantially right angles. The pixel 103 is provided at the intersection of the gate line and the source line. For color display, the pixels 103 corresponding to the respective colors of red, green, and blue (RGB) are arranged in sequence in the display portion 102. Note that the pixels of RGB can be arranged in a stripe pattern, a mosaic pattern, a delta pattern, or the like as appropriate. Without limitation to RGB, white, yellow, or the like may be added to RGB for color display.

Figure 10A:
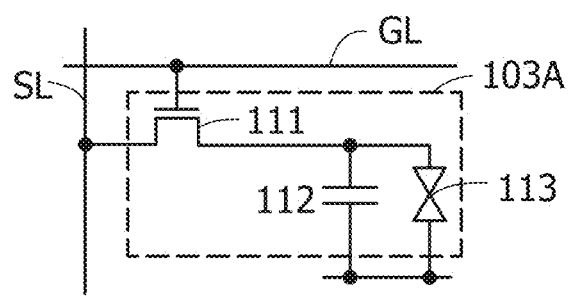
FIGS. 10A and 10B are circuit diagrams illustrating one embodiment of the present invention.
Figure 10B:
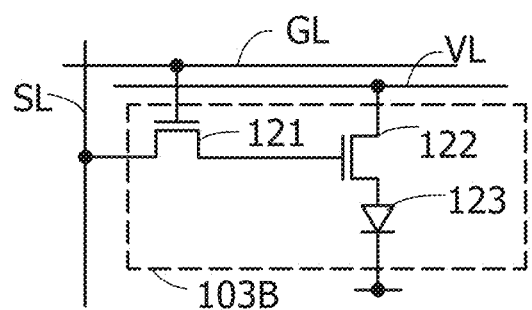

Configuration examples of the pixel 103 are illustrated in FIGS. 10A and 10B.

A pixel 103A in FIG. 10A is an example of a pixel included in a liquid crystal display device and includes a transistor 111, a capacitor 112, and a liquid crystal element 113.

The transistor 111 serves as a switching element for controlling the connection between the liquid crystal element 113 and the source line SL. The on/off state of the transistor 111 is controlled by a scan signal supplied to its gate through the gate line GL.

The capacitor 112 is an element formed by stacking conductive layers, for example.

The liquid crystal element 113 includes a common electrode, a pixel electrode, and a liquid crystal layer, for example. Alignment of the liquid crystal material of the liquid crystal layer is changed by the action of an electric field generated between the common electrode and the pixel electrode.

A pixel 103B in FIG. 10B is an example of a pixel included in an EL display device and includes a transistor 121, a transistor 122, and an EL element 123. FIG. 10B illustrates a power supply line VL in addition to the gate line GL and the source line SL. The power supply line VL is a wiring for supplying current to the EL element 123.

The transistor 121 serves as a switching element for controlling the connection between a gate of the transistor 122 and the source line SL. The on/off state of the transistor 121 is controlled by a scan signal supplied to its gate through the gate line GL.

The transistor 122 has a function of controlling current flowing between the power supply line VL and the EL element 123, in accordance with voltage applied to the gate of the transistor 122.

The EL element 123 is, for example, an element including a light-emitting layer provided between electrodes. The luminance of the EL element 123 can be controlled by the amount of current that flows through the light-emitting layer.

The above circuit block diagram of the display device includes the level shifter LS, the pass transistor logic PTL, and the amplifier AMP described in Embodiment 1; thus, the circuit area of the source driver can be small as in Embodiment 1. Consequently, the size of the display device can be reduced. Moreover, according to one embodiment of the present invention, the transistors in the source driver can have high withstand voltage; thus, a highly reliable semiconductor device can be provided.

This embodiment can be implemented in appropriate combination with any of the other embodiments.

Embodiment 3

This embodiment will explain an oxide semiconductor layer that can be used as a semiconductor layer of the transistor with low off-state current described in the foregoing embodiment.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For this reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment. Moreover, treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

The transistor including an i-type or substantially i-type oxide semiconductor film can have extremely favorable off-state current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or higher, 2 V or higher, or 3 V or higher.

The oxide semiconductor film may contain one or more of an oxide semiconductor having a single crystal structure (hereinafter referred to as single crystal oxide semiconductor), an oxide semiconductor having a polycrystalline structure (hereinafter referred to as polycrystalline oxide semiconductor), an oxide semiconductor having a microcrystalline structure (hereinafter referred to as microcrystalline oxide semiconductor), and an oxide semiconductor having an amorphous structure (hereinafter referred to as amorphous oxide semiconductor). The oxide semiconductor film may be a c-axis aligned crystalline oxide semiconductor (CAAC-OS) film. Furthermore, the oxide semiconductor film may contain an amorphous oxide semiconductor and an oxide semiconductor having a crystal grain. A CAAC-OS and a microcrystalline oxide semiconductor are described below as typical examples.

First, a CAAC-OS film is described.

The CAAC-OS film is an oxide semiconductor film having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter such a surface is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 11A is a cross-sectional TEM image of a CAAC-OS film. FIG. 11B is a cross-sectional TEM image obtained by enlarging the image of FIG. 11A. In FIG. 11B, atomic arrangement is highlighted for easy understanding.

FIG. 11C is Fourier transform images of regions each surrounded by a circle (with a diameter of approximately 4 nm) between A and O and between O and A' in FIG. 11A. C-axis alignment can be observed in each region in FIG. 11C. The c-axis direction between A and O is different from that between O and A', which indicates that a grain in the region between A and O is different from that between O and A'. In addition, between A and O, the angle of the c-axis changes gradually and continuously from 14.3° to 16.6° to 26.4°. Similarly, between O and A', the angle of the c-axis changes gradually and continuously from −18.3° to −17.6° to −15.9°.

In an electron diffraction pattern of the CAAC-OS film, spots (bright spots) indicating alignment are shown. For example, when electron diffraction with an electron beam having a diameter of 1 nm to 30 nm, for example (such electron diffraction is also referred to as nanobeam electron diffraction) is performed on the top surface of the CAAC-OS film, spots are observed (see FIG. 12A).

From the results of the cross-sectional TEM image and the plan-view TEM image, alignment is found in the crystal parts of the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm or more, 5 μm$^2$ or more, or 1000 μm$^2$ or more is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently at a diffraction angle (2θ of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently at 2θ of around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed when φ scan is performed with 2θ fixed at around 56°.

According to the above results, in the CAAC-OS film, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, when the shape of the CAAC-OS film is changed by etching or the like, the c-axis of the crystal might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Moreover, when an impurity is added to the CAAC-OS film, a region to which the impurity is added is altered, and the proportion of the c-axis aligned crystal parts in the CAAC-OS film sometimes varies depending on regions.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. The impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. In a TEM image of the nc-OS film, a grain boundary cannot be found clearly in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are sometimes shown. Also in a nanobeam electron diffraction pattern of the nc-OS film, a plurality of spots are sometimes shown in a ring-like region (see FIG. 12B).

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 12A:
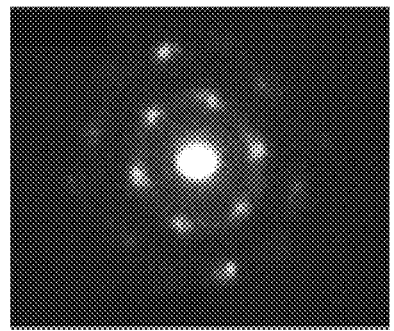
FIGS. 12A and 12B show nanobeam electron diffraction patterns of oxide semiconductor films.
Figure 12B:
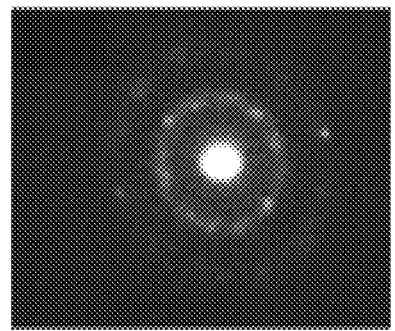
Figure 12C:
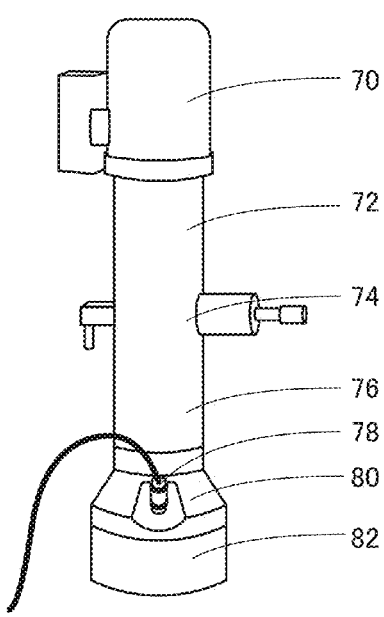
FIGS. 12C and 12D illustrate an example of a transmission electron diffraction measurement apparatus.

FIG. 12C illustrates a transmission electron diffraction measurement apparatus that includes an electron gun chamber 70, an optical system 72 below the electron gun chamber 70, a sample chamber 74 below the optical system 72, an optical system 76 below the sample chamber 74, an observation chamber 80 below the optical system 76, a camera 78 installed in the observation chamber 80, and a film chamber 82 below the observation chamber 80. The camera 78 is provided to face toward the inside of the observation chamber 80. Note that the film chamber 82 is not necessarily provided.

Figure 12D:
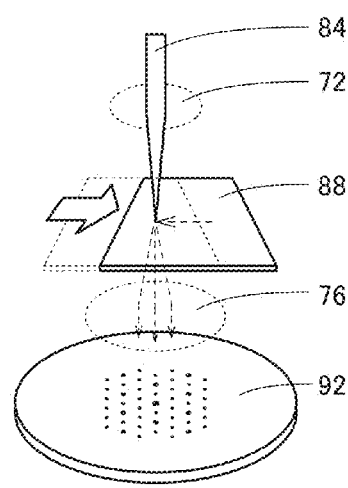

FIG. 12D illustrates an internal structure of the transmission electron diffraction measurement apparatus in FIG. 12C. In the transmission electron diffraction measurement apparatus, a substance 88 that is positioned in the sample chamber 74 is irradiated with electrons emitted from an electron gun installed in the electron gun chamber 70 through the optical system 72. The electrons that have passed through the substance 88 enter a fluorescent plate 92 installed in the observation chamber 80 through the optical system 76. A pattern depending on the intensity of the incident electrons appears in the fluorescent plate 92, so that the transmission electron diffraction pattern can be measured.

The camera 78 is installed to face the fluorescent plate 92 and can take an image of a pattern appearing in the fluorescent plate 92. An angle formed by an upper surface of the fluorescent plate 92 and a straight line that passes through the center of a lens of the camera 78 and the center of the fluorescent plate 92 ranges from 15° to 80°, from 30° to 75°, or from 45° to 70°, for example. As the angle becomes smaller, distortion of the transmission electron diffraction pattern taken by the camera 78 becomes larger. Note that if the angle is obtained in advance, the distortion of an obtained transmission electron diffraction pattern can be corrected. The film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 88.

Next, a method for measuring a transmission electron diffraction pattern of a substance by the aforementioned transmission electron diffraction measurement apparatus will be described.

For example, changes in the structure of a substance can be observed by changing the irradiation position of the electrons 84 that are a nanobeam on the substance (or by scanning) as illustrated in FIG. 12D. At this time, when the substance 88 is a CAAC-OS film, a diffraction pattern such as one shown in FIG. 12A is observed. When the substance 88 is an nc-OS film, a diffraction pattern such as one shown in FIG. 12B is observed.

Even when the substance 88 is a CAAC-OS film, a diffraction pattern similar to that of an nc-OS film or the like is partly observed in some cases. Therefore, the quality of a CAAC-OS film can be sometimes represented by the proportion of a region where a diffraction pattern of a CAAC-OS film is observed in a predetermined area (also referred to as proportion of CAAC (c-axis aligned crystal)). In a high-quality CAAC-OS film, for example, the proportion of CAAC is 50% or higher, preferably 80% or higher, further preferably 90% or higher, still further preferably 95% or higher. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/s and the obtained diffraction patterns were converted into still images every 0.5 seconds. As an electron beam, a nanobeam with a probe diameter of 1 nm was used. The above measurement was performed on six samples. The proportion of CAAC was calculated using the average value of the six samples.

Figure 13A:
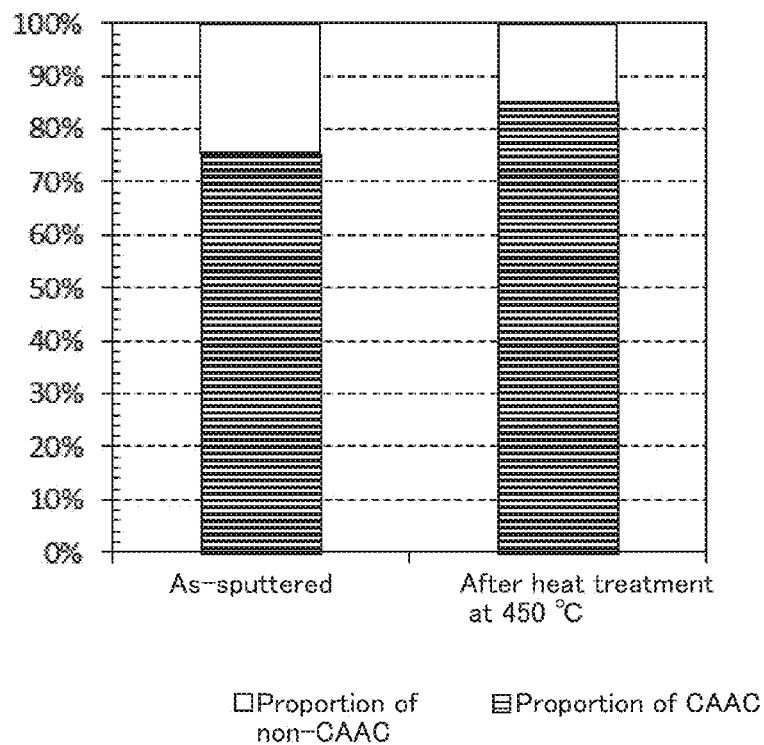
FIG. 13A shows an example of structural analysis by transmission electron diffraction measurement.

FIG. 13A shows the proportion of CAAC in each sample. The proportion of CAAC of the as-sputtered CAAC-OS film was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., 400° C. or higher) reduces the proportion of non-CAAC (increases the proportion of CAAC). The above results also indicate that the CAAC-OS film can have a high proportion of CAAC even when the temperature of the heat treatment is lower than 500° C.

Here, most of diffraction patterns different from that of a CAAC-OS film were similar to that of an nc-OS film. Furthermore, an amorphous oxide semiconductor film was not observed in the measurement region. Therefore, the above results suggest that the region having a structure similar to that of an nc-OS film is rearranged by heat treatment owing to the influence of the structure of the adjacent region, whereby the region becomes CAAC.

Figure 13B:
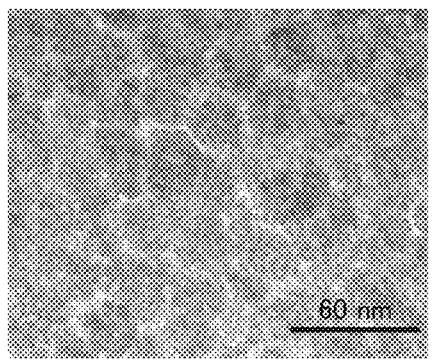
FIGS. 13B and 13C are plan-view TEM images.
Figure 13C:
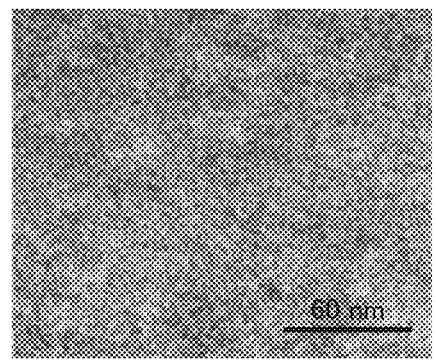

FIGS. 13B and 13C are plan-view TEM images of the as-sputtered CAAC-OS film and the CAAC-OS film subjected to the heat treatment at 450° C., respectively. Comparison between FIGS. 13B and 13C shows that the CAAC-OS film subjected to the heat treatment at 450° C. has more uniform film quality. That is, heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

Embodiment 4

In this embodiment, an example of a cross-sectional structure of a transistor used in a semiconductor device of one embodiment of the disclosed invention will be described with reference to drawings.

Figure 14:
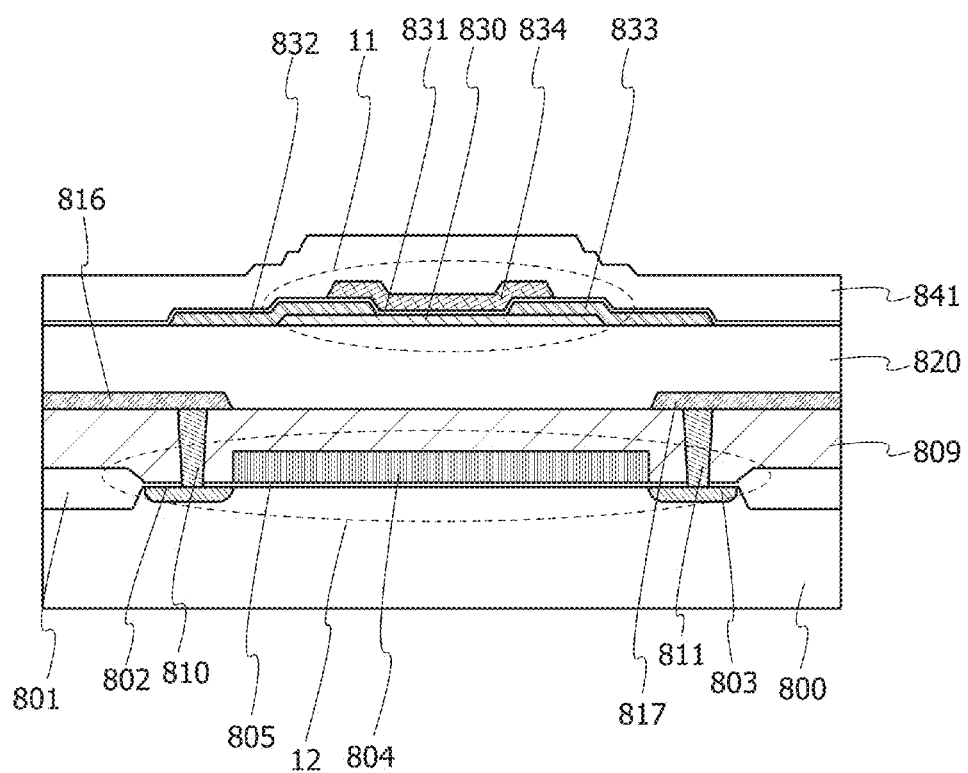
FIG. 14 is a cross-sectional view illustrating one embodiment of the present invention.

FIG. 14 illustrates an example of part of the cross-sectional structure of the semiconductor device in one embodiment of the present invention. FIG. 14 illustrates the transistor 11 and the transistor 12 shown in FIG. 2.

In this embodiment, the transistor 12 is formed in a single crystal silicon substrate, and the transistor 11 including a semiconductor layer containing an oxide semiconductor is formed above the transistor 12. The transistor 12 may include a thin semiconductor layer of silicon, germanium, or the like in an amorphous, microcrystalline, polycrystalline, or single crystal state.

When the transistor 12 is formed using a thin silicon film, any of the following can be used, for example: amorphous silicon formed by sputtering or vapor phase growth such as plasma-enhanced CVD; polycrystalline silicon obtained by crystallization of amorphous silicon by laser annealing or the like; and single crystal silicon obtained by separation of a surface portion of a single crystal silicon wafer by implantation of hydrogen ions or the like into the silicon wafer.

FIG. 14 illustrates a structure where the transistor 11 is formed above the transistor 12. With the structure in FIG. 14, a channel formation region of the transistor 11 and a channel formation region of the transistor 12 can be provided to overlap with each other; thus, the layout area of a semiconductor device can be small. In the cross-sectional structure in FIG. 14, the channel length L of the transistor 11 is smaller than that of the transistor 12. Since the OS transistor has high withstand voltage, even such a structure results in a semiconductor device having the transistor with high withstand voltage and high reliability.

In FIG. 14, the p-channel transistor 12 is formed in a semiconductor substrate 800.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). FIG. 14 illustrates an example where an p-type single crystal silicon substrate is used.

The transistor 12 is electrically isolated from another transistor by an element isolation insulating film 801. The element isolation insulating film 801 can be formed by a local oxidation of silicon (LOCOS) method, a trench isolation method, or the like.

Specifically, the transistor 12 includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps a channel formation region formed between the impurity regions 802 and 803 with the gate insulating film 805 positioned between the gate electrode 804 and the channel formation region.

An insulating film 809 is provided over the transistor 12. Openings are formed in the insulating film 809. Wirings 810 and 811 that are in contact with the impurity regions 802 and 803, respectively, are formed in the openings.

The wiring 810 is connected to a wiring 816 formed over the insulating film 809. The wiring 811 is connected to a wiring 817 formed over the insulating film 809.

An insulating film 820 is formed over the wirings 816 and 817.

In FIG. 14, the transistor 11 is formed over the insulating film 820.

The transistor 11 includes, over the insulating film 820, a semiconductor film 830 containing an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps the semiconductor film 830 between the conductive films 832 and 833.

An insulating film 841 is provided over the transistor 111.

Figure 15A:
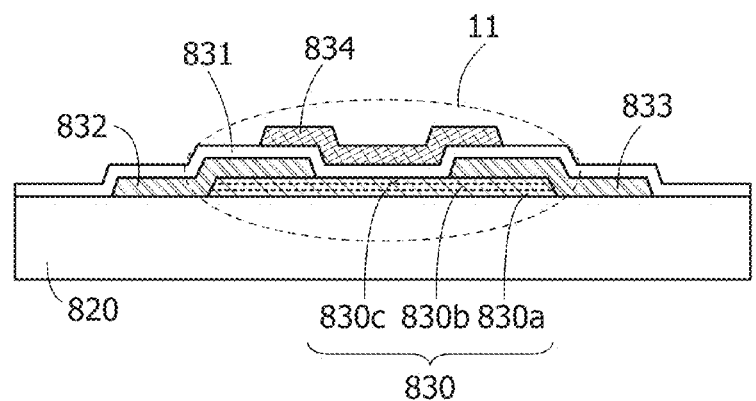
FIGS. 15A and 15B are cross-sectional views each illustrating one embodiment of the present invention.

The semiconductor film 830 is not limited to a single oxide semiconductor film and may be stacked oxide semiconductor films. FIG. 15A illustrates an example of the transistor 11 in which the semiconductor film 830 has a three-layer structure.

The transistor 11 illustrated in FIG. 15A includes the semiconductor film 830 over the insulating film 820 and the like, the conductive films 832 and 833 electrically connected to the semiconductor film 830, the gate insulating film 831, and the gate electrode 834 provided over the gate insulating film 831 so as to overlap the semiconductor film 830.

As the semiconductor film 830 in the transistor 11, oxide semiconductor layers 830a to 830c are stacked sequentially from the insulating film 820 side.

The oxide semiconductor layers 830a and 830c are each an oxide film that contains at least one of metal elements contained in the oxide semiconductor layer 830b. The energy at the bottom of the conduction band of the oxide semiconductor layers 830a and 830c is closer to a vacuum level than that of the oxide semiconductor layer 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 830b preferably contains at least indium to increase carrier mobility.

Figure 15B:
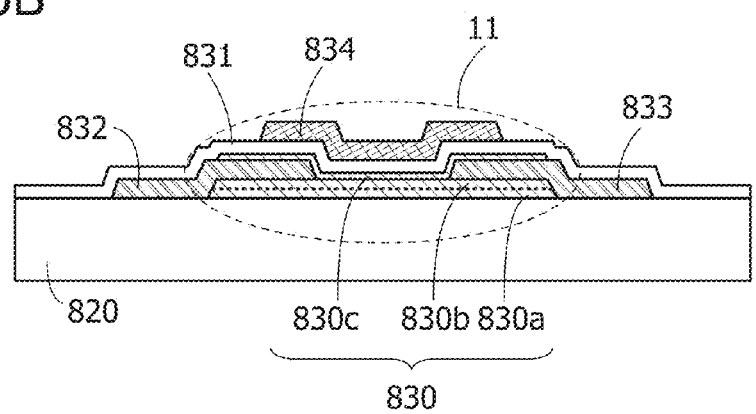

As illustrated in FIG. 15B, the oxide semiconductor layer 830c may be provided over the conductive films 832 and 833 so as to overlap with the gate insulating film 831.

The cross-sectional structure in FIG. 14 enables a semiconductor device to have a smaller circuit area than a semiconductor device using only Si transistors with large channel length L. In the semiconductor device with the cross-sectional structure in FIG. 14, the transistors can have high withstand voltage without increasing in size. As a result, a highly reliable semiconductor device can be provided.

In the case where the mobility of a Si transistor is higher than that of an OS transistor, the channel width W of the OS transistor is set larger than that of the Si transistor.

This embodiment can be implemented in appropriate combination with any of the other embodiments.

Embodiment 5

Although the conductive film and the semiconductor film described in the above embodiments can be formed by sputtering, they may be formed by another method, for example, a thermal CVD method. Examples of a thermal CVD method include metal organic chemical vapor deposition (MOCVD) and atomic layer deposition (ALD).

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For instance, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of a substrate to form a first layer, and then, the second source gas is introduced to react with the first layer. As a result, a second layer is stacked over the first layer, so that a thin film is formed. The sequence of the gas introduction is repeated multiple times until a desired thickness is obtained, whereby a thin film with excellent step coverage can be formed. The thickness of the thin film can be adjusted by the number of repetitions of the sequence of the gas introduction; therefore, an ALD method makes it possible to accurately adjust a thickness and thus is suitable for manufacturing a minute FET.

The conductive film and the semiconductor film described in the above embodiments can be formed by thermal CVD such as MOCVD or ALD. For example, trimethylindium, trimethylgallium, and dimethylzinc are used to form an In—Ga—Zn—O film. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, when a tungsten film is formed with a deposition apparatus using ALD, a $WF_6$ gas and a $B_2H_6$ gas are sequentially introduced multiple times to form an initial tungsten film, and then a $WF_6$ gas and an $H_2$ gas are introduced at a time, so that a tungsten film is formed. Note that a $SiH_4$ gas may be used instead of a $B_2H_6$ gas.

When an oxide semiconductor film, for example, an In—Ga—Zn—O film is formed with a deposition apparatus using ALD, an $In(CH_3)_3$ gas and an $O_3$ gas are sequentially introduced multiple times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Although an $H_2O$ gas obtained by bubbling with an inert gas such as Ar may be used instead of an $O_3$ gas, it is preferable to use an $O_3$ gas, which does not contain H.

Furthermore, an $In(C_2H_5)_3$ gas may be used instead of an $In(CH_3)_3$ gas. A $Ga(C_2H_5)_3$ gas may be used instead of a $Ga(CH_3)_3$ gas. Moreover, a $Zn(CH_3)_2$ gas may be used.

The structure described in this embodiment can be combined as appropriate with any of the structures described in the other embodiments.

Embodiment 6

In this embodiment, an application example of the semiconductor device described in the foregoing embodiments to an electronic component, application examples of the electronic component to a display module, an application example of the display module, and application examples of an electronic device will be described with reference to FIGS. 16A and 16B, FIGS. 17A and 17B, FIG. 18, and FIGS. 19A to 19E.

<Application Example to Electronic Component>

Figure 16A:
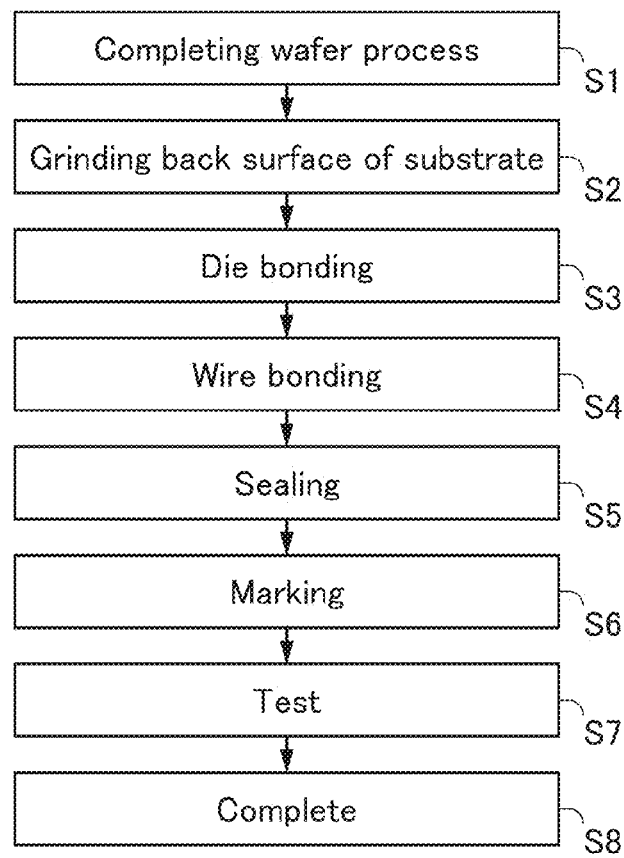
FIG. 16A is a flowchart showing a fabrication process of an electronic component.

FIG. 16A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 14 of Embodiment 4 is completed by integrating detachable components on a printed circuit board through the assembly process (post-process).

The post-process can be completed through steps shown in FIG. 16A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to an interposer is performed (Step S3). To bond a chip and an interposer in the die bonding step, resin bonding, tape-automated bonding, or the like is selected as appropriate depending on products.

Next, wire bonding for electrically connecting a wire of the interposer and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, printing process (marking) is performed on a surface of the package (Step S6). Then, through a final test step (Step S7), the electronic component is completed (Step S8).

Since the electronic component described above includes the semiconductor device described in the foregoing embodiment, it is possible to obtain a small and highly reliable electronic component.

Figure 16B:
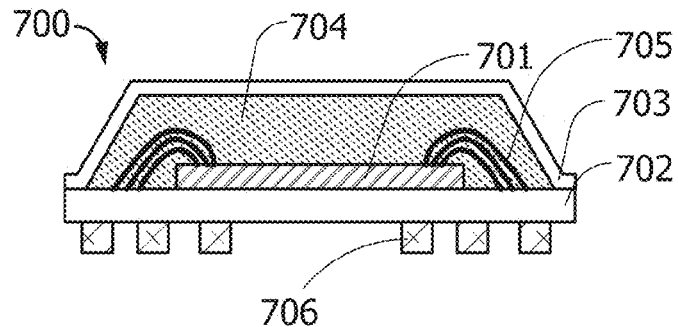
FIG. 16B is a schematic cross-sectional view of the electronic component.

FIG. 16B is a schematic cross-sectional view of a completed electronic component. In an electronic component 700 illustrated in FIG. 16B, a semiconductor device 701 is provided on a surface of an interposer 702. The semiconductor device 701 is connected to a wiring on the surface of the interposer 702 via a wire 705 to be electrically connected to a bump terminal 706 provided on the back surface of the interposer 702. The semiconductor device 701 over the interposer 702 is sealed by a package 703 with a space between the interposer 702 and the package 703 filled with an epoxy resin 704.

The electronic component 700 in FIG. 16B is mounted on a flexible printed circuit (FPC) or a display panel, for example.

<Examples of Mounting Electronic Component on Display Panel>

Next, examples of a display panel with the semiconductor device used for a source driver IC will be described with reference to FIGS. 17A and 17B.

Figure 17A:
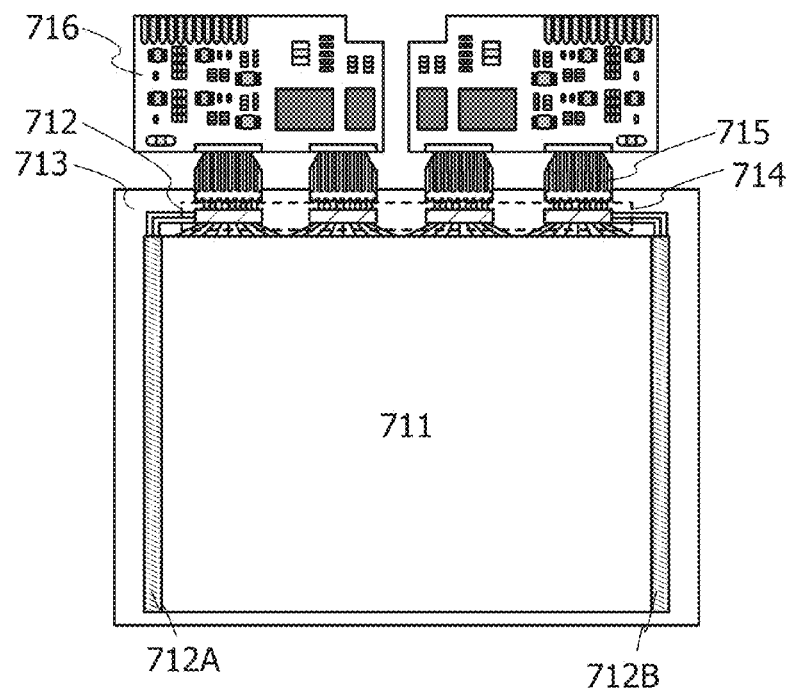
FIGS. 17A and 17B each illustrate a display panel including an electronic component.

FIG. 17A illustrates an example where a source driver 712 and gate drivers 712A and 712B are provided around a display portion 711 and a source driver IC 714 is mounted on a substrate 713 as the source driver 712.

The source driver IC 714 is mounted on a substrate 713 using an anisotropic conductive adhesive and an anisotropic conductive film.

The source driver IC 714 is connected to an external circuit board 716 via an FPC 715.

Figure 17B:
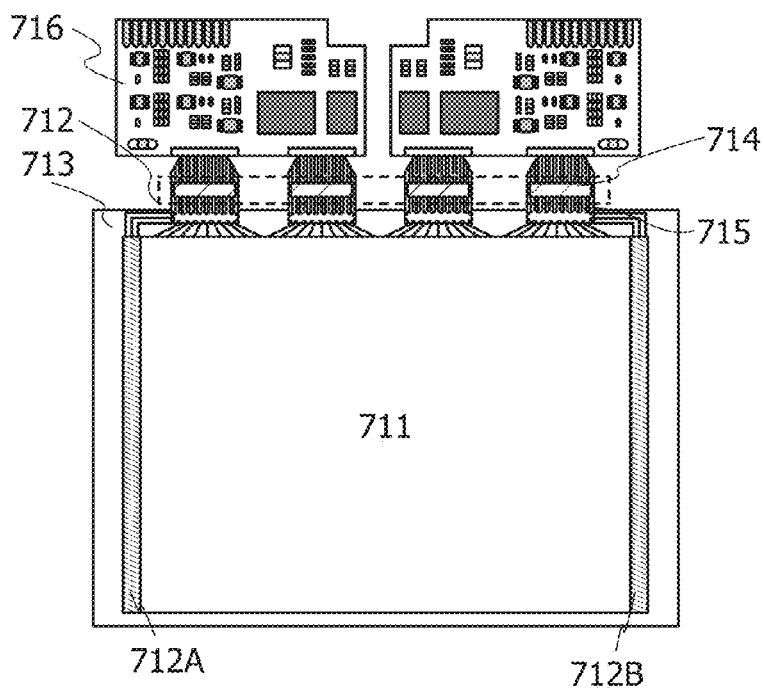

FIG. 17B illustrates an example where the source driver 712 and the gate drivers 712A and 712B are provided around the display portion 711 and the source driver IC 714 is mounted on the FPC 715 as the source driver 712.

Mounting the source driver IC 714 on the FPC 715 allows a larger display portion 711 to be provided over the substrate 713, resulting in a narrower frame.

<Application Example of Display Module>

Next, an application example of a display module using the display panel illustrated in FIG. 17A or FIG. 17B will be described with reference to FIG. 18.

Figure 18:
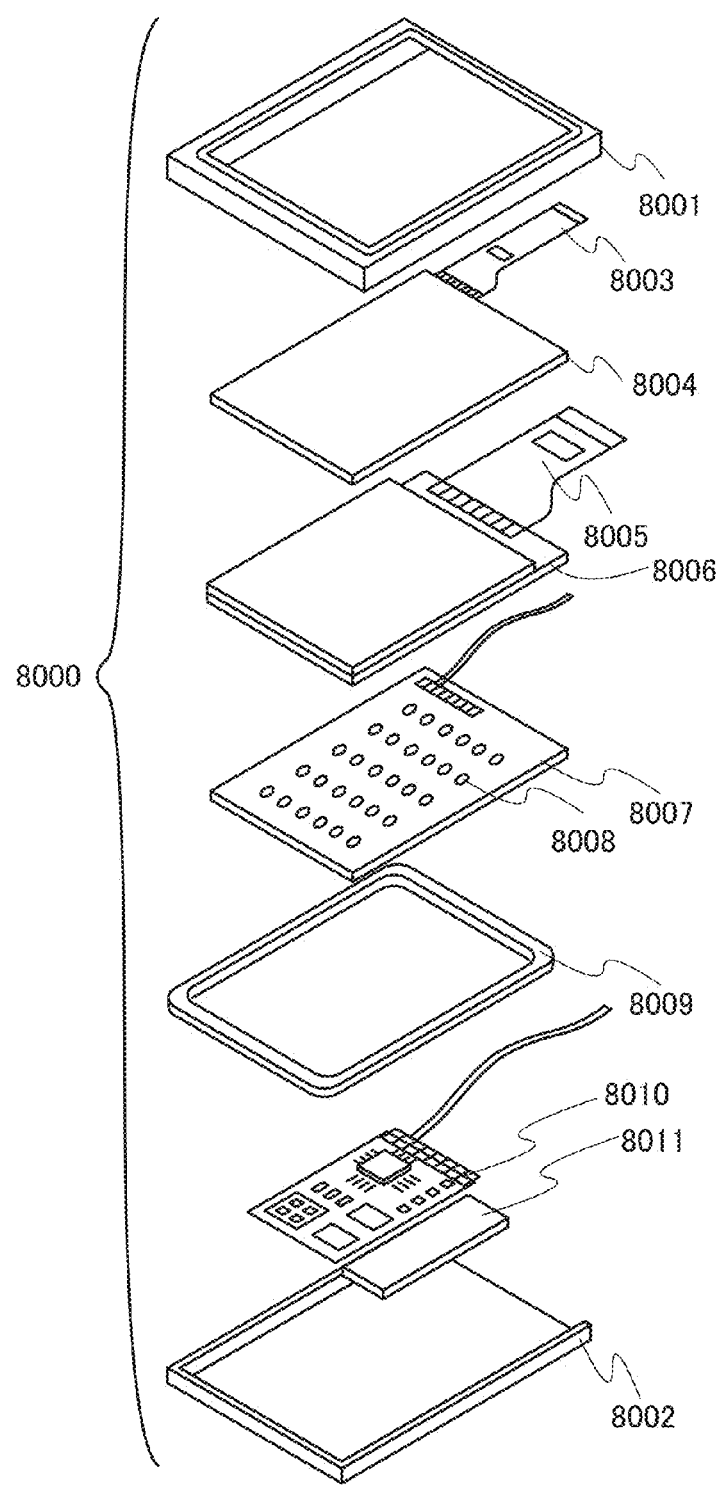
FIG. 18 illustrates a display module including a display panel.

In a display module 8000 illustrated in FIG. 18, a touch panel 8004 connected to an FPC 8003, a display panel 8006 connected to an FPC 8005, a backlight unit 8007, a frame 8009, a printed circuit board 8010, and a battery 8011 are provided between an upper cover 8001 and a lower cover 8002. Note that the backlight unit 8007, the battery 8011, the touch panel 8004, and the like are not provided in some cases.

The display panel illustrated in FIG. 17A or FIG. 17B can be used as the display panel 8006 in FIG. 18.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can be formed to overlap with the display panel 8006. It is also possible to provide a touch panel function for a counter substrate (sealing substrate) of the display panel 8006. Alternatively, a photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 is provided with a power supply circuit and a signal processing circuit for outputting a video signal and a clock signal. As a power source for supplying power to the power supply circuit, an external commercial power source or a separate power source using the battery 8011 may be used. The battery 8011 can be omitted in the case of using a commercial power source.

The display module 8000 may be additionally provided with a polarizing plate, a retardation plate, a prism sheet, or the like.

<Application Examples of Electronic Component to Electronic Device>

Next, an electronic device having a display panel including the above electronic component will be described. Examples of the electronic device include a computer, a portable information appliance (including a mobile phone, a portable game machine, and an audio reproducing device), electronic paper, a television device (also referred to as television or television receiver), and a digital video camera.

Figure 19A:
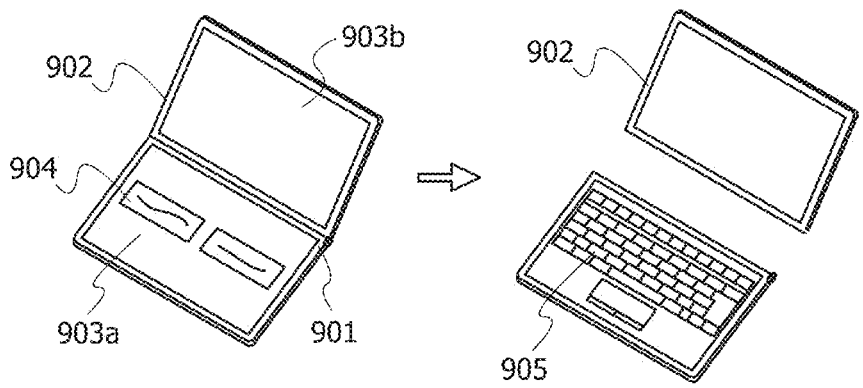
FIGS. 19A to 19E each illustrate an electronic device including an electronic component.

FIG. 19A illustrates a portable information appliance that includes a housing 901, a housing 902, a first display portion 903a, a second display portion 903b, and the like. At least one of the housings 901 and 902 is provided with the electronic component including the semiconductor device of the foregoing embodiment. It is thus possible to obtain a small and highly reliable portable information appliance.

The first display portion 903a is a panel having a touch input function, and for example, as illustrated in the left of FIG. 19A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 19A. Thus, letters can be input quickly by key input as in a conventional information appliance, for example.

One of the first display portion 903a and the second display portion 903b can be detached from the portable information appliance as shown in the right of FIG. 19A. Providing the second display portion 903b with a touch input function makes the information appliance convenient because a weight to carry around can be further reduced and the information appliance can operate with one hand while the other hand supports the housing 902.

The portable information appliance in FIG. 19A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 19A may transmit and receive data wirelessly. Through wireless communication, desired book data or the like can be purchased and downloaded from an e-book server.

Furthermore, the housing 902 in FIG. 19A may be equipped with an antenna, a microphone function, and a wireless communication function to be used as a mobile phone.

Figure 19B:
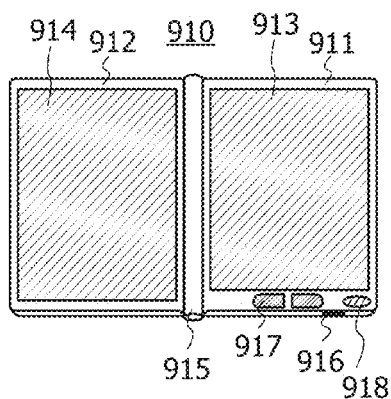

FIG. 19B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The electronic component including the semiconductor device of the foregoing embodiment is provided in at least one of the housings 911 and 912. It is thus possible to obtain a small and highly reliable e-book reader.

Figure 19C:
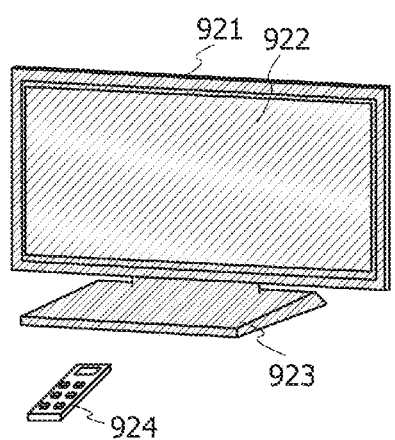

FIG. 19C illustrates a television device including a housing 921, a display portion 922, a stand 923, and the like. The television device can be controlled by a switch of the housing 921 and a separate remote controller 924. The electronic component including the semiconductor device of the foregoing embodiment is mounted on the housing 921 and the remote controller 924. Thus, it is possible to obtain a small and highly reliable television device.

Figure 19D:
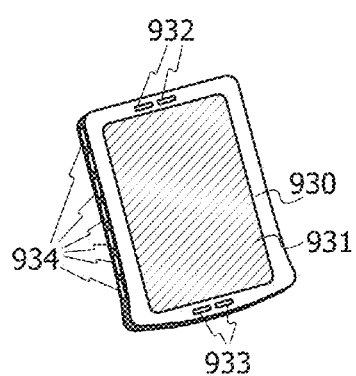

FIG. 19D illustrates a smartphone in which a main body 930 is provided with a display portion 931, a speaker 932, a microphone 933, an operation button 934, and the like. The electronic component including the semiconductor device of the foregoing embodiment is provided in the main body 930. It is thus possible to obtain a small and highly reliable smartphone.

Figure 19E:
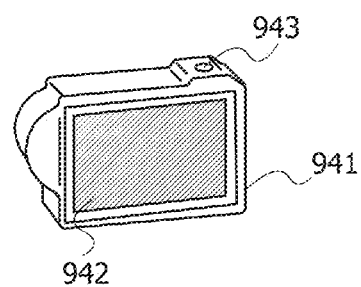

FIG. 19E illustrates a digital camera including a main body 941, a display portion 942, an operation switch 943, and the like. The electronic component including the semiconductor device of the foregoing embodiment is provided in the main body 941. Consequently, it is possible to obtain a small and highly reliable digital camera.

As described above, the electronic device shown in this embodiment incorporates the electronic component including the semiconductor device of the foregoing embodiment, thereby being reduced in size and having high reliability.

This application is based on Japanese Patent Application serial no. 2014-044471 filed with Japan Patent Office on Mar. 7, 2014, the entire contents of which are hereby incorporated by reference.

What is claimed is:

1. A semiconductor device comprising:
a first circuit, a second circuit, and a third circuit,
wherein:
the first circuit receives a first signal and is configured to boost a first voltage of the first signal into a second voltage,
the second circuit is configured to convert the first signal into a second signal,
the third circuit receives the second signal and is configured to amplify a first amount of current of the second signal to a second amount of current and is configured to output the second amount of current,
the second circuit comprises first to fourth wirings and first to third transistors,
wherein one of a source and a drain of the first transistor is electrically connected to the first wiring,
wherein one of a source and a drain of the second transistor is electrically connected to the second wiring,
wherein one of a source and a drain of the third transistor is electrically connected to the third wiring,
wherein the other of the source and the drain of the first transistor, the other of the source and the drain of the second transistor, and the other of the source and the drain of the third transistor is directly connected to the fourth wiring,
wherein gates of the first to third transistor is electrically connected to the first circuit,
wherein the fourth wiring is electrically connected to the third circuit,
the first to third wirings are configured to transmit different voltages,
the first to third transistors are configured to operate as switches, and
each of the first to third transistors comprises a semiconductor layer comprising an oxide semiconductor.

2. The semiconductor device according to claim 1, wherein:
the first circuit comprises a fourth transistor and a fifth transistor,
the fourth transistor is electrically connected to a wiring applying the first voltage,
the fifth transistor is electrically connected to a wiring applying the second voltage,
the fourth transistor comprises a semiconductor layer comprising silicon, and
the fifth transistor comprises a semiconductor layer comprising an oxide semiconductor.

3. An electronic component comprising:
the semiconductor device according to claim 1; and
a bump terminal electrically connected to the semiconductor device.

4. An electronic device comprising:
the electronic component according to claim 3; and
a display device.

5. A semiconductor device comprising:
a first circuit, a second circuit, and a third circuit,
wherein:
the first circuit receives a first signal and is configured to boost a first voltage of the first signal into a second voltage,
the second circuit is configured to convert the first signal into a second signal,
the third circuit receives the second signal and is configured to amplify a first amount of current of the second signal to a second amount of current and is configured to output the second amount of current,
the second circuit comprises a plurality of wirings, a first transistor, and a second transistor,
wherein one of a source and a drain of the first transistor is electrically connected to the first wiring,
wherein one of a source and a drain of the second transistor is electrically connected to the second wiring,
wherein one of a source and a drain of the third transistor is electrically connected to the third wiring,
wherein the other of the source and the drain of the first transistor, the other of the source and the drain of the second transistor, and the other of the source and the drain of the third transistor is directly connected to the fourth wiring,
wherein gates of the first to third transistor is electrically connected to the first circuit,
wherein the fourth wiring is electrically connected to the third circuit,
the plurality of wirings comprise a first wiring configured to transmit the first voltage, and a second wiring configured to transmit the second voltage higher than the first voltage, the first to third transistors are configured to operate as switches, the first transistor comprises a semiconductor layer comprising an oxide semiconductor, and the second transistor comprises a semiconductor layer comprising silicon.

6. The semiconductor device according to claim 5, wherein:

the first circuit comprises a third transistor and a fourth transistor, the third transistor is electrically connected to a wiring applying the first voltage, the fourth transistor is electrically connected to a wiring applying the second voltage, the third transistor comprises a semiconductor layer comprising silicon, and the fourth transistor comprises a semiconductor layer comprising an oxide semiconductor.

7. An electronic component comprising:

the semiconductor device according to claim 5; and a bump terminal electrically connected to the semiconductor device.

8. An electronic device comprising:

the electronic component according to claim 7; and a display device.

9. The semiconductor device according to claim 5, wherein the first transistor is positioned over an insulating film, wherein the insulating film is positioned over the second transistor, and wherein a channel region of the first transistor and a channel region of the second transistor overlap with each other.

* * * * *